(12) United States Patent
Ooishi et al.

(10) Patent No.: US 6,788,571 B2
(45) Date of Patent: Sep. 7, 2004

(54) THIN FILM MAGNETIC MEMORY DEVICE HAVING AN ACCESS ELEMENT SHARED BY A PLURALITY OF MEMORY CELLS

(75) Inventors: Tsukasa Ooishi, Hyogo (JP); Masatoshi Ishikawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/301,838

(22) Filed: Nov. 22, 2002

(65) Prior Publication Data

US 2003/0218901 A1 Nov. 27, 2003

(30) Foreign Application Priority Data

May 23, 2002 (JP) ........................................ 2002-148995

(51) Int. Cl.$^7$ ............................................. G11C 11/14
(52) U.S. Cl. ........................ 365/171; 365/157; 365/161
(58) Field of Search ................................ 365/171, 161, 365/157, 158, 173, 213, 230.03, 232, 189.01, 189.04

(56) References Cited

U.S. PATENT DOCUMENTS 6,317,376 B1    11/2001   Tran et al.
6,587,370 B2 *  7/2003    Hirai ........................... 365/171
2003/0117838 A1 * 6/2003   Hidaka ........................ 365/171

OTHER PUBLICATIONS

Roy Scheuerlein et al., "A 10ns Read and Write Non–Volatile Memory Array using a Magnetic Tunnel Junction and FET Switch in Each Cell", ISSCC Digest of Technical Papers, TA7.2, Feb. 2000, pp. 94–95, 129–129, 409–410.
M. Durlam et al., "Nonvolatile RAM based on Magnetic Tunnel Junction Elements", ISSCC Digest of Technical Papers, TA7.3, Feb. 2000, pp. 96–97, 130–131, 410–411.

* cited by examiner

Primary Examiner—Thong Q. Le
(74) Attorney, Agent, or Firm—McDermott Will & Emery LLP

(57) ABSTRACT

A tunneling magneto-resistance element forming an MTJ memory cell is connected between a bit line and a strap. In each memory cell column, the strap is shared by the plurality of tunneling magneto-resistance elements in the same row block. The access transistor is connected between strap and ground voltage, and is turned on/off in response to a corresponding word line. Storage data is read from the selected memory cell based on a comparison between results of data reading effected on a memory cell group coupled to the same strap before and after application of a predetermined magnetic field to the selected memory cell.

11 Claims, 24 Drawing Sheets

FIG.4

| NUMBER OF MEMORY CELLS PER STRAP | 1 | 2 | 4 | 8 | 16 | 32 | ... |
|---|---|---|---|---|---|---|---|
| EFFECTIVE MEMORY CELL SIZE ($F^2$) | $4+\alpha$ | $4+\dfrac{\alpha}{2}$ | $4+\dfrac{\alpha}{4}$ | $4+\dfrac{\alpha}{8}$ | $4+\dfrac{\alpha}{16}$ | $4+\dfrac{\alpha}{32}$ | ... |

MEMORY CELL SIZE: $4 \sim 8F^2$ ($4F^2$ IN THIS EXAMPLE)
ACCESS TRANSISTOR SIZE: $\alpha F^2$

THIN FILM MAGNETIC MEMORY DEVICE HAVING AN ACCESS ELEMENT SHARED BY A PLURALITY OF MEMORY CELLS

BACKGROUND OF THE INVENTION

1. Field of the Invention

The present invention relates to a thin film magnetic memory device, and particularly to a random access memory provided with memory cells having MTJs (Magnetic Tunnel Junctions).

2. Description of the Background Art

Attention is being given to an MRAM (Magnetic Random Memory) device as a memory device, which can nonvolatilely store data with low power consumption. The MRAM device is a memory device, in which a plurality of thin film magnetic members are formed in a semiconductor integrated circuit for nonvolatilely storing data, and random access to each thin film magnetic member is allowed.

Particularly, in recent years, it has been announced that a performance of the MRAM device can be dramatically improved by using the thin film magnetic members, which utilize the magnetic tunnel junctions, as memory cells. The MRAM device with memory cells having the magnetic tunnel junctions has been disclosed in technical references such as "A 10 ns Read and Write Non-Volatile Memory Array Using a Magnetic Tunnel Junction and FET Switch in Each Cell", ISSCC Digest of Technical Papers, TA7.2, February 2000 and "Nonvolatile RAM Based on Magnetic Tunnel Junction Elements", ISSCC Digest of Technical Papers, TA7.3, February 2000.

FIG. 22 conceptually shows a structure of a memory cell, which has a tunnel junction, and may be merely referred to as a "MTJ memory cell" hereinafter.

Referring to FIG. 22, an MTJ memory cell includes a tunneling magneto-resistance element TMR having an electric resistance, which is variable in accordance with a data level of magnetically written storage data, and an access transistor ATR. Access transistor ATR is located between a bit line BL and a ground voltage line GL, and is connected in series to tunneling magneto-resistance element TMR. Typically, access transistor ATR is formed of a field-effect transistor.

For the MTJ memory cell, the device includes bit line BL for carrying a data write current and a data read current in a data write operation and a data read operation, respectively, a write digit line WDL for carrying the data write current in the data write operation, a word line WL for instructing data reading, and ground voltage line GL for puling down tunneling magneto-resistance element TMR to a ground voltage GND in the data read operation.

In the data read operation, tunneling magneto-resistance element TMR is electrically coupled between ground voltage line GL carrying ground voltage GND and bit line BL in response to turn-on of access transistor ATR.

FIG. 23 conceptually shows an operation of writing data in the MTJ memory cell.

Referring to FIG. 23, tunneling magneto-resistance element TMR has a magnetic material layer FL, which has a fixed magnetization direction, and may be merely referred to as a "fixed magnetic layer" hereinafter, and a magnetic material layer VL, which is magnetized in a direction depending on a data write magnetic field caused by the data write current, and may be merely referred to as a "free magnetic layer" hereinafter. A tunneling barrier TB formed of an insulator film is disposed between fixed magnetic layer FL and free magnetic layer VL. Free magnetic layer VL is magnetized in the same direction as fixed magnetic layer FL or in the opposite direction in accordance with the level of the storage data to be written.

Tunneling magneto-resistance element TMR has an electric resistance, which is variable depending on a correlation in magnetization direction between fixed magnetic layer FL and free magnetic layer VL. More specifically, when fixed and free magnetic layers FL and VL are magnetized in the same direction, the electric resistance is smaller than that in the case where these are magnetized in the opposite directions.

In the data write operation, word line WL is inactive, and access transistor ATR is off. In this state, the data write currents for magnetizing free magnetic layer VL are supplied to bit line BL and write digit line WDL in directions depending on the level of write data, respectively. Thus, the magnetization direction of free magnetic layer VL depends on the directions of data write currents flowing through bit line BL and write digit line WDL, respectively.

FIG. 24 conceptually illustrates a relationship between the data write current and the magnetization of the free magnetic layer VL.

Referring to FIG. 24, an abscissa H(EA) gives a magnetic field, which is applied in a direction of an easy axis (EA) to free magnetic layer VL of tunneling magneto-resistance element TMR. An ordinate H(HA) indicates a magnetic field acting in a direction of a hard axis (HA) on free magnetic layer VL. Magnetic fields H(EA) and H(HA) correspond to two magnetic fields produced by currents flowing through bit line BL and write digit line WDL, respectively.

In the MTJ memory cell, the fixed magnetization direction of fixed magnetic layer FL is parallel to the easy axis of free magnetic layer VL, and free magnetic layer VL is magnetized in the direction along the easy axis, and particularly in the same parallel direction, which is the same direction as fixed magnetic layer FL, or in the opposite-parallel direction, which is opposite to the above direction, depending on the level ("1" or "0") of the storage data. The MTJ memory cell can selectively store data ("1" and "0") of one bit depending on the two magnetization directions of free magnetic layer VL.

The magnetization direction of free magnetic layer VL can be rewritten only when a sum of applied magnetic fields H(EA) and H(HA) falls within a region outside an asteroid characteristic line illustrated in FIG. 24. Therefore, the magnetization direction of free magnetic layer VL does not switch when the data write magnetic fields applied thereto have intensities corresponding to a region inside the asteroid characteristic line.

As can be seen from the asteroid characteristic line, the magnetization threshold required for switching the magnetization direction along the easy axis can be lowered by applying the magnetic field in the direction of the hard axis to free magnetic layer VL.

For rewriting the storage data of the MTJ memory cell, i.e., the magnetization direction of tunneling magneto-resistance element TMR, it is necessary to pass the data write currents at a predetermined level or higher through write digit line WDL and bit line BL. Thereby, free magnetic layer VL in tunneling magneto-resistance element TMR is magnetized in the same direction as fixed magnetic layer FL or the opposite (opposite-parallel) direction depending on the direction of the data write magnetic field along the easy axis (EA). The magnetization direction, which was once written into tunneling magneto-resistance element TMR, and thus the storage data of MTJ memory cell is held nonvolatilely until next data writing is executed.

FIG. 25 conceptually shows an operation of reading data from the MTJ memory cell.

Referring to FIG. 25, access transistor ATR is turned on in response to activation of word line WL in the data read operation. Thereby, tunneling magneto-resistance element TMR is electrically coupled to bit line BL while being pulled down with ground voltage GND.

In this state, bit line BL is pulled up with a predetermined voltage, whereby a current path including bit line BL and tunneling magneto-resistance element TMR carries a memory cell current Icell corresponding to the electric resistance of tunneling magneto-resistance element TMR, and thus to the storage data of the MTJ memory cell. For example, this memory cell current Icell is compared with a predetermined reference current, whereby storage data can be read out from the MTJ memory cell.

As described above, the electric resistance of tunneling magneto-resistance element TMR changes in accordance with the magnetization direction, which is rewritable by the data write magnetic field applied thereto. Therefore, non-volatile data storage can be executed by establishing a correlation of electric resistances Rmax and Rmin of tunneling magneto-resistance element TMR with respect to levels ("1" and "0") of the storage data.

In the data read operation, a data read current Is flows through magnetic tunneling junction MTJ. However, data read current Is is generally determined to be smaller by one or two digits than the data write current already described. This reduces a possibility that the storage data of the MTJ memory cell is erroneously rewritten due to data read current Is in the data read operation.

FIG. 26 is shows a structure of the MTJ memory cell formed on a semiconductor substrate.

Referring to FIG. 26, access transistor ATR formed on a semiconductor substrate SUB has source/drain regions 310 and 320 formed of n-type regions as well as a gate region 330. Source/drain region 310 is electrically coupled to ground voltage line GL via a metal film formed in a contact hole 341.

Write digit line WDL is formed in a metal interconnection layer arranged at a higher level than ground voltage line GL. Tunneling magneto-resistance element TMR is arranged at a higher level than write digit line WDL. Tunneling magneto-resistance element TMR is electrically coupled to source/drain region 320 of access transistor ATR via a strap SL and a metal film formed in contact hole 340. Strap SL is provided for electrically coupling tunneling magneto-resistance element TMR to access transistor ATR, and is made of an electrically conductive material.

Bit line BL is electrically coupled to tunneling magneto-resistance element TMR, and is arranged at a higher level than tunneling magneto-resistance element TMR. As already described, the data write currents must flow through both bit line BL and write digit line WDL in the data write operation. In the data read operation, word line WL is activated to attain, e.g., a high voltage level so that access transistor ATR is turned on. Thereby, tunneling magneto-resistance element TMR is pulled down via access transistor ATR to ground voltage GND, and is electrically coupled to bit line BL.

Bit line BL carrying the data write current and data read current as well as write digit line WDL carrying the data write current are made of metal interconnection layers. Word line WL is provided for controlling the gate voltage of access transistor ATR, and is not required to carry positively or actively a current. For increasing a degree of integration or a density, therefore, an independent metal interconnection layer dedicated to word line WL is not generally employed, and word line WL is generally formed at the same interconnection layer as gate 330 by using a polycrystalline silicon layer or a polycide layer.

However, as shown in FIG. 26, strap SL and contact hole 340, which electrically couple tunneling magneto-resistance element TMR and access transistor ATR, are employed for reading data from the MTJ memory cell, and these strap SL and contact hole 340 must be arranged to avoid write digit line WDL. Accordingly, the MRAM device provided with the plurality of MTJ memory cells in an integrated fashion cannot have a sufficiently high element density due to layout restrictions, and an array area thereof becomes large.

SUMMARY OF THE INVENTION

An object of the invention is to provide a thin film magnetic memory device, which allows reduction in area of a memory array provided with MTJ memory cells in an integrated fashion.

In summary, the invention provides a thin film magnetic memory device including a plurality of memory cells, a plurality of first signal lines and a plurality of second signal lines. The plurality of memory cells are arranged in rows and columns, and are divided into a plurality of row blocks each extending in a row direction. Each of the memory cells includes a tunneling magneto-resistance element having an electric resistance variable depending on magnetically written storage data. The plurality of first signal lines are arranged in a column direction, and correspond to the memory cell columns, respectively. The plurality of second signal lines are arranged corresponding to the plurality of row blocks in each of the memory cell columns, respectively. The tunneling magneto-resistance element is electrically coupled between corresponding one of the plurality of first signal lines and corresponding one of the plurality of second signal lines.

Accordingly, the invention has a major advantage that the contact hole, which is conventionally provided under severe layout constraints for electrically coupling the memory cell and another element such as an access transistor, can be arranged only for each second signal line and not for each memory cell. Consequently, an area of a memory array can be reduced.

Preferably, the thin film magnetic memory device includes a plurality of word lines and a plurality of access transistors. The plurality of word lines are arranged in the row direction, correspond to the plurality of row bocks, respectively, and are selectively activated in accordance with results of row selection in a data read operation. The plurality of access transistors are arranged corresponding to the plurality of second signal lines, respectively. Each of the access transistors is electrically coupled between corresponding one of the plurality of second signal lines and a fixed voltage, and is turned on when corresponding one of the word lines is activated.

Since each access transistor can be shared by the plurality of memory cells, it is possible to reduce the number of the required access transistors. Accordingly, the area of the memory array can be further reduced.

Preferably, each of the row blocks has the memory cell rows of L (L: integer larger than one) in number, and the second signal line corresponding to the selected memory cell being selected as an access target is coupled to a first voltage over at least one predetermined period provided during a single data read operation. The thin film magnetic memory device further includes a data line to be electrically coupled to the first signal line corresponding to the selected memory cell during each of the at least one predetermined period, a read current supply circuit for coupling the data line to a second voltage during each of the at least one predetermined period, and a data read circuit for producing read data corresponding to the storage data of the selected memory cell. The data read circuit has a first voltage holding portion for holding, on a first internal node, the voltage carried on the data line over the predetermined period provided corresponding to a first state keeping the selected memory cell to have a magnetization direction substantially same to that before the single data read operation, and a voltage comparing portion for producing the read data in accordance with a difference between the voltage on the first internal node and the voltage carried on the data line over the predetermined period provided corresponding to a second state changing the magnetization direction of the selected memory cell from that in the first state by application of a predetermined magnetic field.

Thereby, the storage data can be extracted from the one selected memory cell among the memory cells of L in number connected to the same second signal line by accessing the memory cells of L in number. Further, the data reading can be executed in the self-reference manner not using a reference cell, and therefore can be executed based on a comparison between voltages obtained via the same data read path including the same memory cell group, data line and others. Accordingly, it is possible to avoid influences by offset and others due to variations in manufacturing of respective circuits forming the data read path, and the data read operation can be performed precisely.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 illustrates an effect of reducing an area of the memory array by sharing access transistors ATR;

DESCRIPTION OF THE PREFERRED EMBODIMENTS

Embodiments of the invention will now be described with reference to the drawings. In the figures, the same or corresponding portions bear the same reference numbers.

First Embodiment

Figure 1:
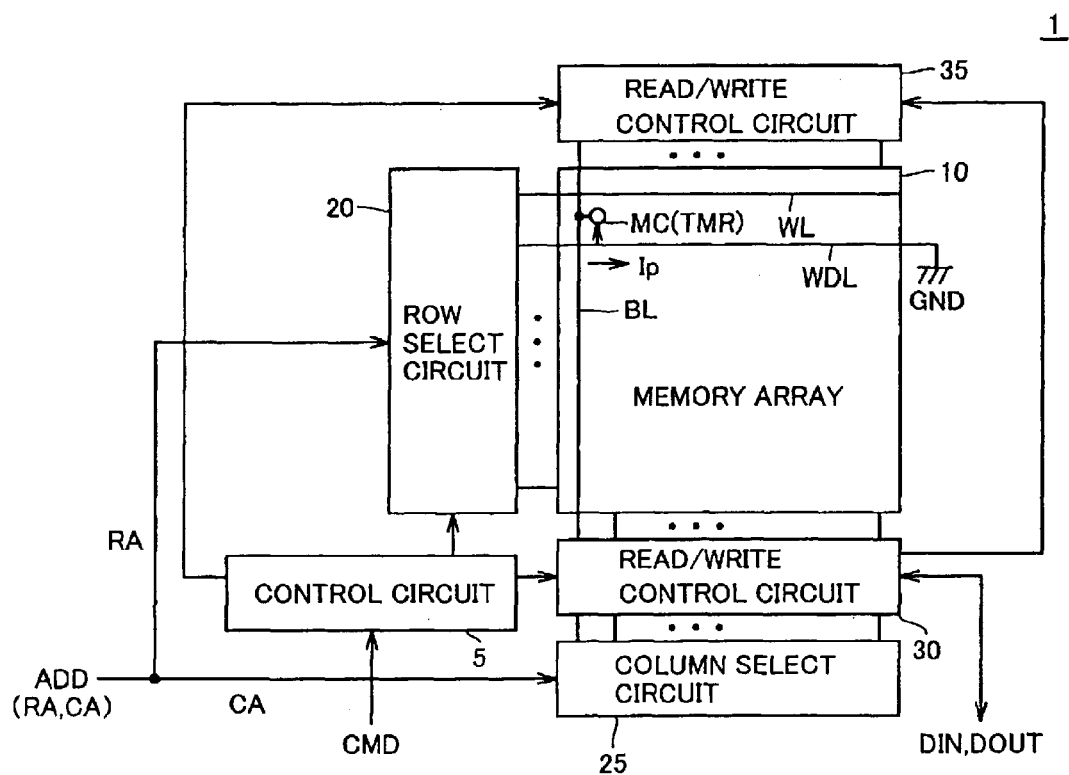
FIG. 1 is a schematic block diagram showing a whole structure of an MRAM device according to an embodiment of the invention.

Referring to FIG. 1, an MRAM device 1 according to a first embodiment of the invention executes random access in response to a control signal CMD and an address signal ADD, which are externally applied, and executes writing of input data DIN and reading of output data DOUT.

MRAM device 1 includes a control circuit 5 for controlling a whole operation of MRAM device 1 in response to control signal CMD, and a memory array 10 having a plurality of MTJ memory cells MC arranged in rows and columns.

According to the first embodiment of the invention, an access transistor ATR is shared by a plurality of tunneling magneto-resistance elements TMR, as will be described later. Therefore, each of the plurality of tunneling magneto-resistance elements TMR functions as MTJ memory cell MC in memory array 10. Accordingly, the rows and columns of the plurality of tunneling magneto-resistance elements TMR in memory array 10 may be referred to as "memory cell rows" and "memory cell columns", respectively.

The structure of tunneling magneto-resistance element TMR and principles of data storage thereof are substantially the same as those already described with reference to FIGS. 22–25, and therefore description thereof is not repeated. Each tunneling magneto-resistance element TMR stores one of H-level ("1") and L-level ("0") as storage data, and an electric resistance thereof changes depending on the level of storage data.

FIG. 1 representatively shows one MTJ memory cell MC (tunneling magneto-resistance element TMR) as well as a word line WL, a write digit line WDL and a bit line BL corresponding to the MTJ memory cell MC. Word line WL and write digit line WDL are arranged in a row direction. Bit line BL is arranged in a column direction.

In a data write operation, data write currents in the row and column directions flow through write digit line WDL in the memory cell row (i.e., selected row) corresponding to the selected memory cell and bit line BL in the memory cell column (i.e., selected column) corresponding to the selected memory cell, respectively. In the data read operation, word line WL corresponding to the selected memory cell is activated, and a data read current flows through the selected memory cell and bit line BL.

Arrangements of the MTJ memory cells and groups of foregoing signal lines in memory array 10 will be described later. In the following description, binary states of the signals, signal lines, data and others, i.e., high-voltage state (power supply voltage Vcc) and low-voltage state (fixed voltage Vss or ground voltage GND) may be referred to as "H-level" and "L-level", respectively.

MRAM device 1 further includes a row select circuit 20, which decodes a row address RA represented by address signal ADD to select the row in memory array 10, a column select circuit 25, which decodes a column address CA represented by address signal ADD to select the column in memory array 10, and read/write control circuits 30 and 35.

Read/write control circuits 30 and 35 collectively represent various circuits or the like such as a circuit for passing the data write current through bit line BL in the data write operation, a circuit for passing the data read current through bit line BL in the data read operation and a circuit for producing output data DOUT in the data read operation. Each write digit line WDL is coupled to ground voltage GND in a region spaced from row select circuit 20 with memory array 10 therebetween.

Figure 2:
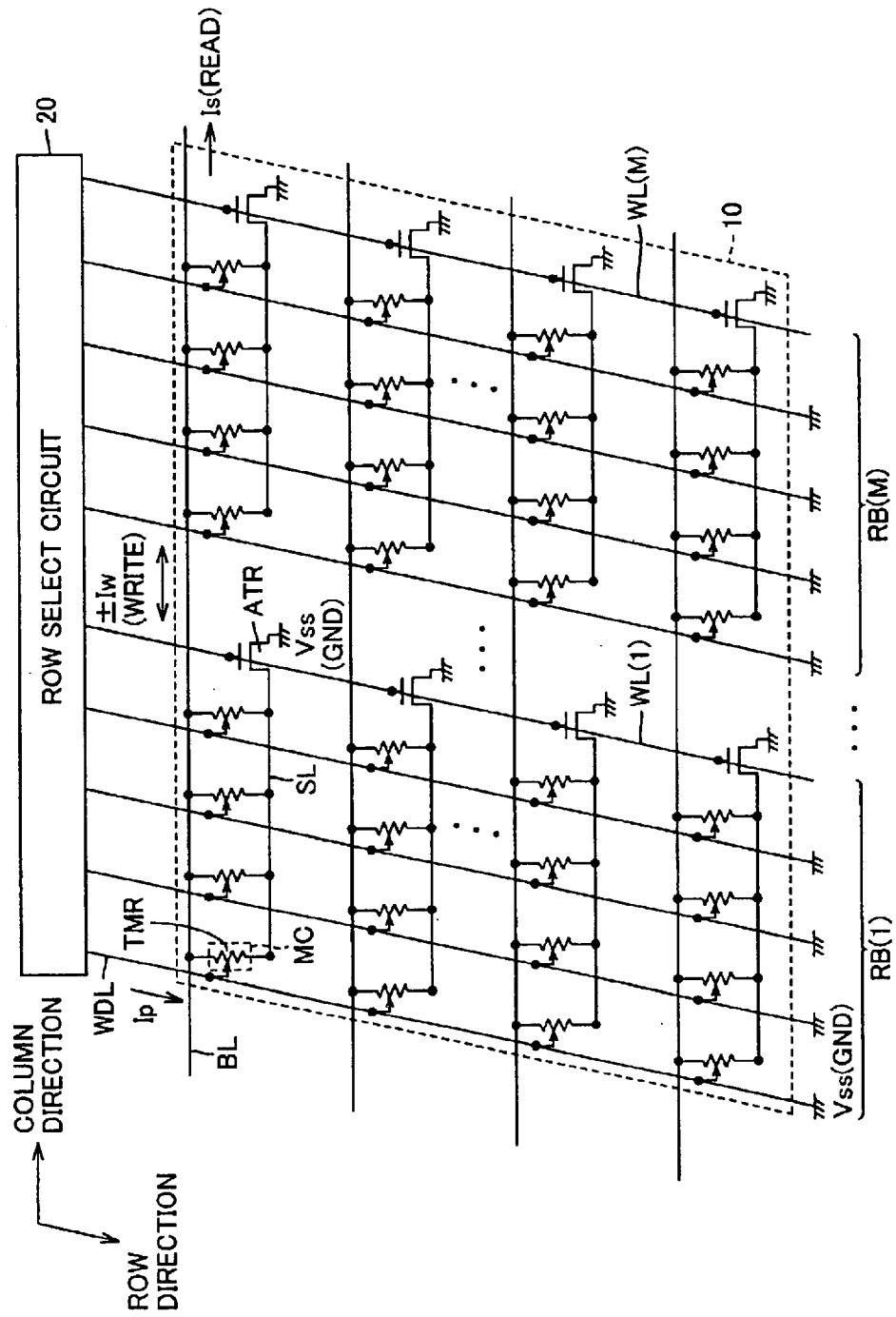
FIG. 2 is a circuit diagram showing by way of example a memory array according to the first embodiment with greater detail.

Referring to FIG. 2, the plurality of MTJ memory cells MC (tunneling magneto-resistance elements TMR) forming rows and columns in memory array 10 are divided along the row direction into a plurality of row blocks RB(1)–RB(M), where M is an integer larger than one. Each of row blocks RB(1)–RB(N) has the memory cell rows of L (L: integer larger than one) in number. FIG. 2 shows an example, in which L is equal to four. In the following description, row blocks RB(1)–RB(M) may be collectively and merely referred to as "row blocks RB".

In each memory cell column, straps SL each serving as a signal line in the column direction are arranged corresponding to row blocks RB(1)–RB(M), respectively. Further, access transistor ATR is arranged corresponding to each strap SL. Thus, each memory cell column includes M access transistors ATR and M straps SL corresponding to the M row groups, respectively.

In each memory cell column, four (L) tunneling magneto-resistance elements TMR belonging to the same row block are coupled to the same strap SL. Thus, each strap SL and each access transistor ATR are shared by L tunneling magneto-resistance elements TMR, which form the same memory cell column and belong to the same row block.

Further, a plurality of word lines WL(1)–WL(M) are arranged corresponding to row blocks RB(1)–RB(M), respectively. Each of the gates of the plurality of access transistors ATR corresponding to the same row block is coupled to the corresponding common word line. For example, each of the gates of access transistors ATR corresponding to row block RB(1) shown in FIG. 2 is coupled to common word line WL(1). Each access transistor ATR is electrically coupled between corresponding strap SL and fixed voltage Vss (e.g., ground voltage GND). In the following description, word lines WL(1)–WL(M) may be collectively and merely referred to as "word lines WL".

Bit lines BL correspond to the memory cell columns, respectively, and extend in the column direction. Write digit lines WDL correspond to the memory cell rows, respectively, and extend in the row direction.

In the data read operation, row select circuit 20 selectively activates one of word lines WL(1)–WL(M) corresponding to the selected memory cell in accordance with the results of row selection. In accordance with the activation of word line WL, the strap coupled to the selected memory cell (i.e., the strap which may be referred to as the "selected strap" hereinafter) is coupled to fixed voltage Vss. Thereby, L tunneling magneto-resistance elements TMR, which include the selected memory cell and are coupled to the selected strap, (i.e., L tunneling magneto-resistance elements TMR of a group which may be referred to as a "selected memory cell group" hereinafter" are connected between corresponding bit line BL and fixed voltage Vss.

In the data read operation, therefore, bit line BL in the selected column carries a data read current Is corresponding to the electric resistance of the whole selected memory cell group. As will be described later in greater detail, the MRAM device according to the embodiment of the invention performs the data reading by detecting a passing current (electric resistance) of one selected memory cell included in the selected memory cell group, and therefore performs so-called "self-reference reading" based on data read current Is passing through the selected memory cell group without employing a reference cell.

In the data write operation, row select circuit 20 is coupled to power supply voltage Vcc for activating write digit line WDL selected in accordance with the results of row selection. Write digit line WDL thus activated is connected at its opposite ends to power supply voltage Vcc and fixed voltage Vss, respectively. Accordingly, a data write current Ip can flow in the row direction through active write digit line WDL. Data write current Ip in the row direction flows in a uniform direction regardless of the level of the write data.

However, row select circuit 20 maintains fixed voltage Vss on unselected write digit lines WDL. Therefore, data write current Ip does not flow in the row direction through unselected write digit lines WDL. In the data write operation, a data write current +Iw or −Iw flows in a direction depending on the write data through bit line BL in the selected column, as will be described later in greater detail.

Consequently, the data is magnetically written into tunneling magneto-resistance element TMR, which corresponds to write digit line WDL and bit line BL both carrying the data write currents.

Description will now be given on a layout of the memory array.

Figure 3:
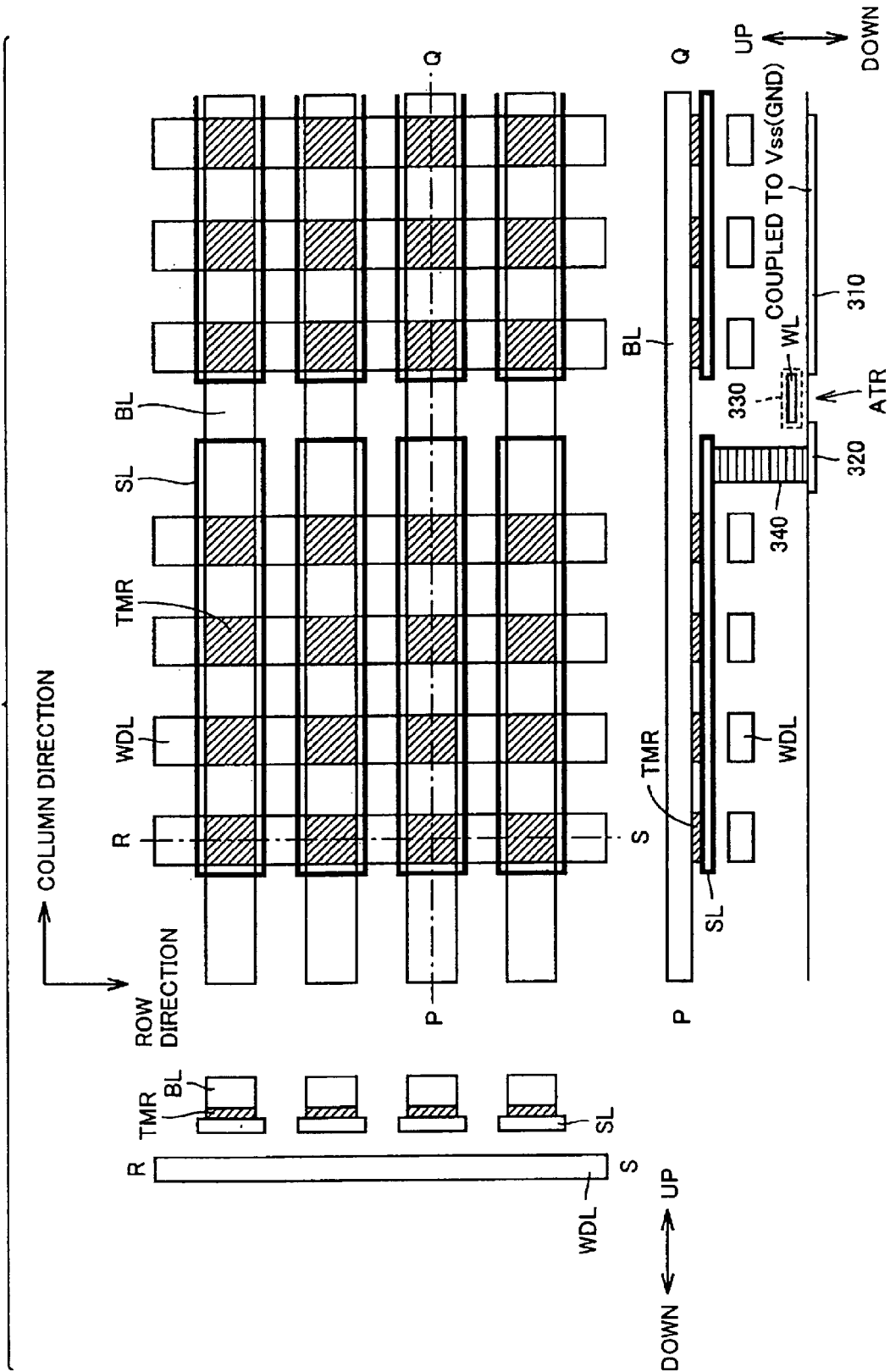
FIG. 3 shows by way of example a layout of MTJ memory cells in the memory array according to the first embodiment.

FIG. 3 shows by way of example of the layout of the MTJ memory cells in the memory array according to the first embodiment. In a central portion, which is a plan view, FIG. 3 shows four columns of the memory cells in each of neighboring two row blocks.

Referring to this plan view, write digit lines WDL corresponding to the respective memory cell rows are arranged in the row direction, and bit lines BL corresponding to the respective memory cell columns are arranged in the column direction.

In FIG. 3, crossings between bit lines BL and write digit lines WDL are hatched in FIG. 3, and tunneling magneto-resistance elements TMR each serving as the MTJ memory cell are arranged corresponding to the crossings, respectively. In each memory cell column, strap SL is shared by four (L) tunneling magneto-resistance elements TMR.

FIG. 3 also shows cross sections of a sub-array SA taken along lines P-Q and R-S in the plan view.

Referring to the cross section taken along line P-Q, source/drain region 310 of access transistor ATR is electrically coupled to fixed voltage Vss (ground voltage GND) via a contact hole (not shown). Source/drain region 320 is electrically coupled to corresponding strap SL via contact hole 340. In gate region 330 of access transistor ATR, word line WL extends in the row direction. Write digit line WDL extending in the row direction is arranged in a layer intermediate between word line WL and strap SL.

In the cross section taken along line R-S, FIG. 3 also shows a sectional structure including write digit line WDL. In this R-S section, only write digit line WDL and structures higher than it are shown.

Write digit line WDL carries the data write current for writing the data into tunneling magneto-resistance element TMR, and therefore is arranged in a region immediately under tunneling magneto-resistance element TMR. Accordingly, tunneling magneto-resistance element TMR electrically coupled to strap SL and bit line BL is arranged at a layer higher than write digit line WDL. As already described, the plurality of tunneling magneto-resistance elements TMR, which neighbor to each other and belong to the same row group, are coupled to the same strap SL. As described above, strap SL is shared by the plurality of tunneling magneto-resistance elements TMR, and this structure can reduce the required number of access transistors ATR and therefore the required area of the layout.

Referring to FIG. 4, F represents a minimum design unit, which is an allowed minimum interconnection width. In this case, one tunneling magneto-resistance element TMR usually has an area in a range from $4F^2$ to $8F^2$. In FIG. 4, it is assumed that one tunneling magneto-resistance element TMR has an area of $4F^2$.

Figure 22:
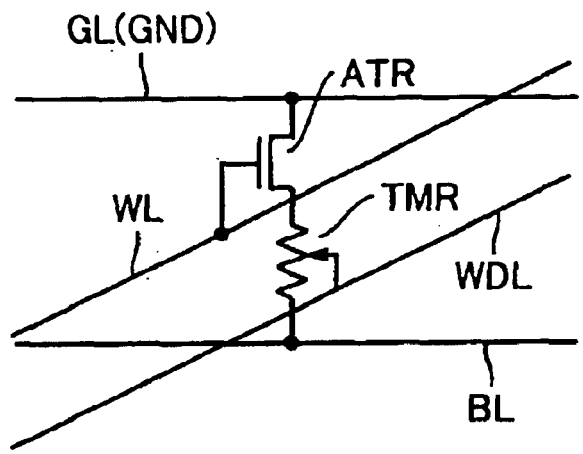
FIG. 22 schematically shows a structure of the MTJ memory cell.
Figure 23:
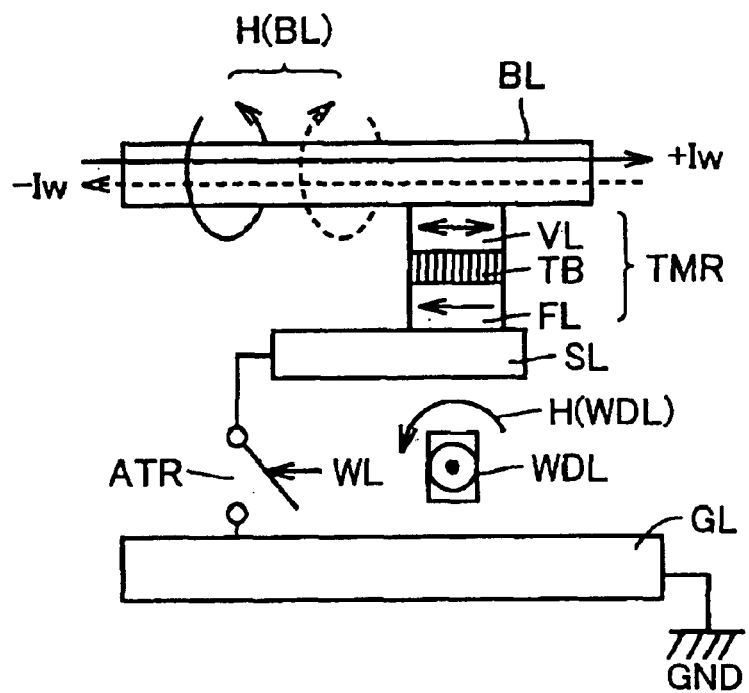
FIG. 23 conceptually shows a data write operation for the MTJ memory cell.
Figure 24:
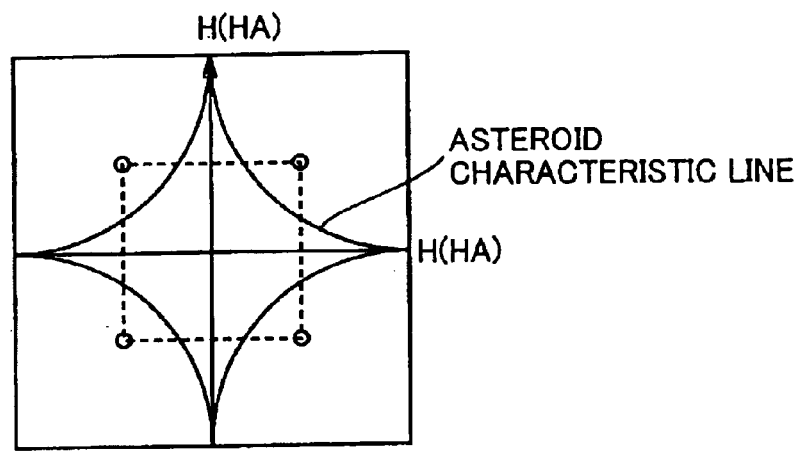
FIG. 24 conceptually illustrates a relationship between a data write current and magnetization of a free magnetic layer VL.
Figure 25:
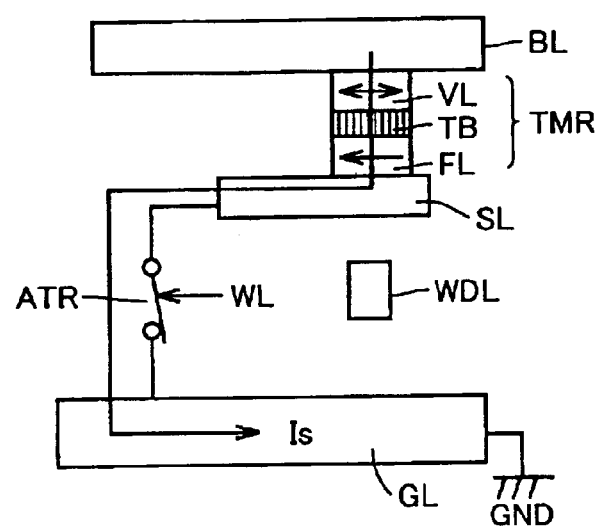
FIG. 25 conceptually shows reading of data from an MTJ memory cell.
Figure 26:
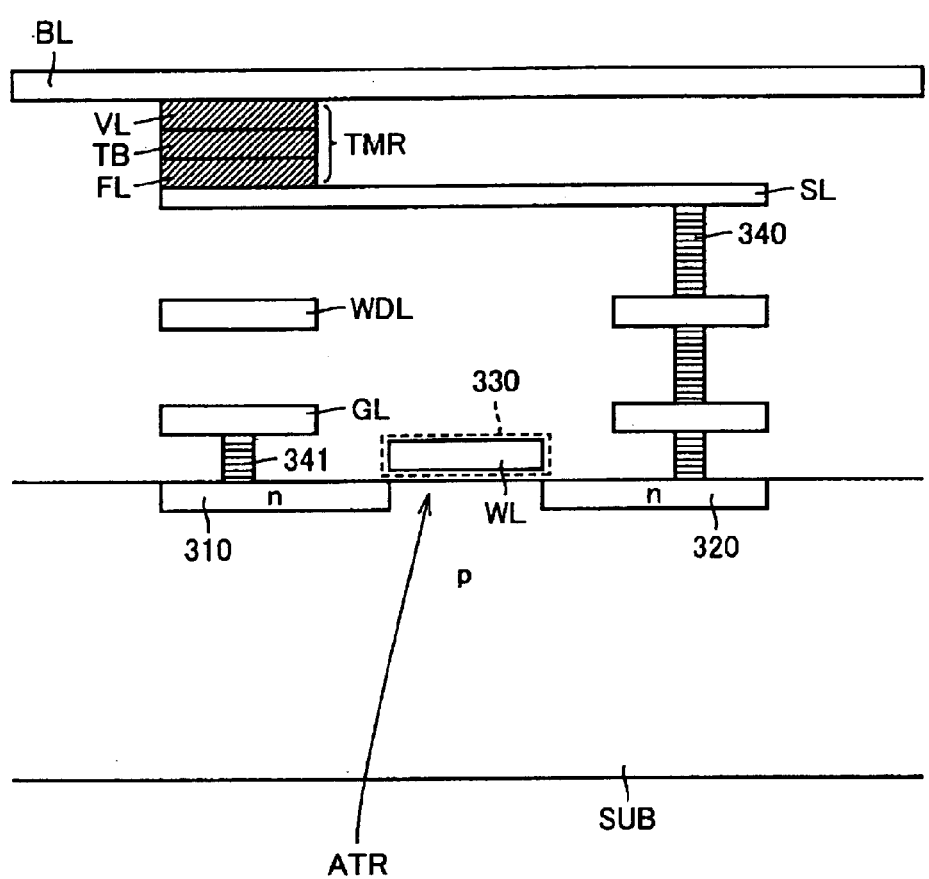
FIG. 26 shows a structure of an MTJ memory cell formed on a semiconductor substrate.

It is assumed that the arrangement of access transistor ATR increases the area of memory cells by $\alpha F^2$. In this case, if access transistor ATR is arranged for each memory cell as shown in FIG. 22, and thus only one memory cell is connected to the same strap, each MTJ memory cell has an effective memory size represented by $(4+\alpha)F^2$.

In contrast to the above, the memory array structure according to the embodiment of the invention can suppress the effective memory size of each MTJ memory cell to $(4+\alpha/M)F^2$, where M represents the number of memory cells connected to the same strap. Consequently, increase in area due to access transistors ATR can be suppressed, and it is possible to reduce the area of the memory array provided with the MTJ memory cells in an integrated fashion.

Further, as can be seen in FIG. 3, such a structure is not required that contact hole 340 is arranged corresponding to each tunneling magneto-resistance element TMR for electrically coupling access transistor ATR and tunneling magneto-resistance element TMR together. Consequently, arrangement pitches of tunneling magneto-resistance elements TMR in the row and column directions can be smaller than those in the structure provided with access transistors ATR each corresponding to different tunneling magneto-resistance element TMR. This can likewise reduce the area of the memory array.

Operations of writing and reading data into and from the memory array according to the first embodiment will now be described in greater detail.

Figure 5:
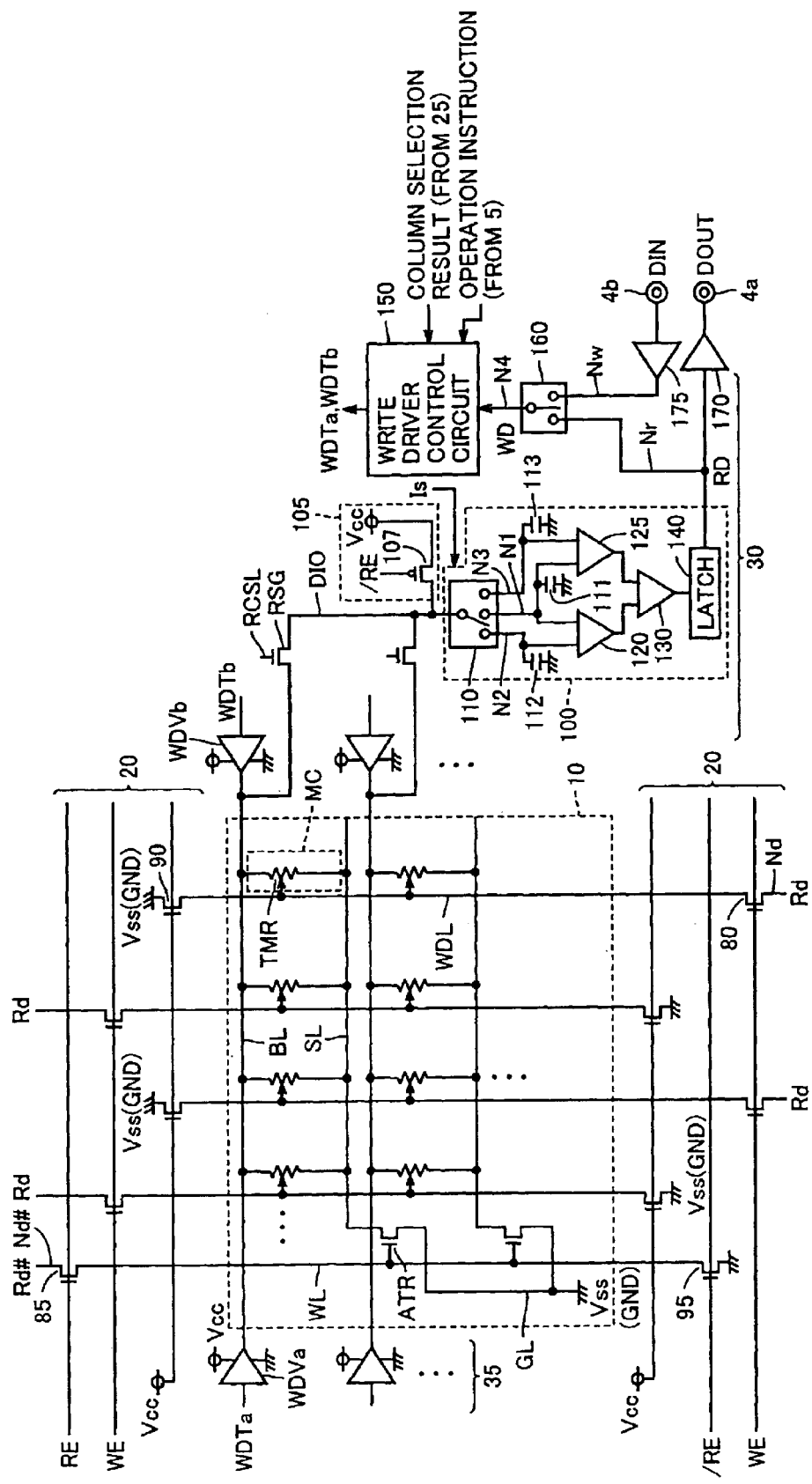
FIG. 5 is a circuit diagram showing a structure of a circuit group for executing a data read operation and a data write operation on the memory array according to the first embodiment.

Referring to FIG. 5, tunneling magneto-resistance element TMR has an electric resistance corresponding to the magnetization direction, as already described. Before the data reading, tunneling magneto-resistance element TMR in each MTJ memory cell is magnetized in the predetermined direction for storing data at H-level ("1") or L-level ("0") so that it has an electric resistance of Rmax or Rmin. Each tunneling magneto-resistance element TMR is connected between corresponding bit line BL and strap SL.

Each strap SL is coupled to voltage line GL via corresponding access transistor ATR. Voltage line GL transmits fixed voltage Vss (ground voltage GND). Thereby, each tunneling magneto-resistance element TMR is electrically coupled between fixed voltage Vss and corresponding bit line BL, in the selected row block corresponds to word line WL activated to kept H-level.

Description will now be given on the circuit structure of row select circuit 20 for selecting the row in memory array 10.

Row select circuit 20 has transistor switches 80 and 90 provided corresponding to each memory cell row, and transistor switches 85 and 95 provided corresponding to each row group. For example, each of transistor switches 80, 85, 90 and 95 is formed of an N-channel MOS transistor. Transistor switches 80 and 90 control activation of corresponding write digit line WDL based on a decode signal Rd representing results of the decoding of the corresponding memory cell row. Transistor switches 85 and 95 control the activation of corresponding word line WL based on a decode signal Rd# representing results of the decoding of corresponding row group.

Decode signals Rd and Rd# are obtained by decode circuits (not shown), and are set to H-level (power supply voltage Vcc) when corresponding memory cell row and row group include the selected memory cell. Thus, decode signals Rd and Rd# corresponding to the selected memory cell are set to H-level (power supply voltage Vcc), and decode signals Rd and Rd# other than the above are set to L-level (fixed voltage Vss or ground voltage GND). Decode signals Rd and Rd# are sent to nodes Nd and Nd#, respectively. Each of nodes Nd and Nd# keeps the level during at least one data read operation and during at least one data write operation.

Transistor switch 80 is arranged between node Nd and one end side of write digit line WDL, and transistor switch 90 is arranged between the other end side of write digit line WDL and fixed voltage Vss. Transistor switch 80 receives on its gate a control signal WE. Transistor switch 90 receives power supply voltage Vcc on its gate, and therefore always keeps the on state.

Accordingly, write digit line WDL corresponding to decode signal Rd, which is set to H-level in response to activation (H-level) of control signal WE, carries data write current Ip in a predetermined direction from transistor switch 80 to transistor switch 90. In contrast to this, write digit line WDL, which corresponds to decode signal Rd set to L-level, carries fixed voltage Vss (ground voltage GND) on its opposite ends, and therefore does not carry the data write current even when control signal WE is active.

Transistor switch 85 is arranged between node Nd# and one end side of word line WL, and transistor switch 95 is arranged between the other end side of word line WL and fixed voltage Vss (ground voltage GND). Transistor switch 85 receives control signal RE on its gate, and transistor switch 95 receives on its gate an inverted signal/RE of control signal RE.

Accordingly, each word line WL is isolated from fixed voltage Vss (ground voltage GND) when each transistor switch 95 is turned off in response to the activation (H-level) of control signal RE. Transistor switch 85 is turned on in response to control signal RE, and activates corresponding word line WL to attain H-level in accordance with the voltage on node Nd, i.e., decode signal Rd# of the corresponding row block.

In response to the above activation, access transistor ATR corresponding to the selected row block is turned on so that L tunneling magneto-resistance elements TMR (selected memory cell group) are connected in parallel between bit line BL and fixed voltage Vss via strap SL. In the row blocks corresponding to the decode signals Rd#, which are set to L-level, corresponding word lines WL are inactive and at L-level so that access transistors ATR is kept off. In this manner, the row select operation is executed in memory array 10.

Structures similar to the above are provided corresponding to each word line WL and each write digit line WDL. As shown in FIG. 5, transistor switches 80, 85, 90 and 95 in each memory cell row and in each row block may be staggered with respect to those in the neighboring memory cell row and neighboring row block. Thereby, row select circuits 20 can be arranged efficiently in a small area.

Read/write control circuit 30 further includes a write driver control circuit 150 and a switch circuit 160. Write driver control circuit 150 responds to an operation instruction sent from control circuit 5 by setting write control signals WDTa and WDTb for each memory cell column in accordance with write data WD transmitted to a node N4 and the results of column selection sent from column select circuit 25. As will be described later in greater detail, write driver control circuit 150 operates to write data into the selected memory cell in accordance with predetermined timing even during the data read operation in addition to the data write operation.

Switch circuit 160 selectively connects one of nodes Nr and Nw to node N4. In the usual data write operation, switch circuit 160 connects node Nw, which receives input data DIN from an input buffer 175, to node N4.

Read/write control circuit 30 further includes write drivers WDVb arranged corresponding to the memory cell columns, respectively. Likewise, read/write control circuit 35 includes write drivers WDVa arranged corresponding to the memory cell columns, respectively. In each memory cell column, write driver WDVa drives one end side of corresponding bit line BL by either power supply voltage Vcc or fixed voltage Vss (ground voltage GND) in accordance with corresponding write control signal WDTa. Likewise, write driver WDVb drives the other end side of corresponding bit line BL by either power supply voltage Vcc or fixed voltage Vss (ground voltage GND) in accordance with corresponding write control signal WDTb.

In the data write operation, write control signals WDTa and WDTb corresponding to the selected column attain one and the other of H- and L-levels in accordance with the level of write data WD, respectively. For example, when data at H-level ("1") is to be written, write control signal WDTa is set to H-level and write control signal WDTb is set to L-level for passing data write current +Iw from write driver WDVa to write driver WDVb. Conversely, when data at L-level ("0") is to be written, write control signals WDTb and WDTa are set to H- and L-level for passing data write current –Iw from write driver WDVb to write driver WDVa, respectively. In the following description, data write currents +Iw and –Iw in different directions may be collectively expressed as "data write currents ±Iw".

In the unselected column, each of write control signals WDTa and WDTb is set to L-level. During a period other than the data write operation, each write driver WDVa, WDVb sets corresponding bit line BL to floating-state.

When data write currents Ip and ±Iw flow through write digit line WDL and bit line BL, respectively, write data depending on the direction of data write current ±Iw is magnetically written into tunneling magneto-resistance element TMR corresponding to these lines.

Similar structures are provided corresponding to bit line BL of each memory cell column. In the structure shown in FIG. 5, the drive voltages of write drivers WDVa and WDVb may be different from fixed voltage Vss (ground voltage GND) and power supply voltage Vcc.

Description will now be given on the operation of reading data from memory array 10.

Read/write control circuit 30 further includes a data line DIO for transmitting a voltage corresponding to the electric resistance of the selected memory cell, and a read select gate RSG arranged between data line DIO and each bit line BL. Each read select gate RSG has a gate coupled to a read column select line RCSL indicating a state of selection of the corresponding memory cell column. Each read column select line RCSL is activated to attain H-level when the corresponding memory cell column is selected. Structures similar to the above are provided for each memory cell column. Thus, data line DIO is shared by the plurality of bit lines on memory array 10.

According to the above structures, the selected memory cell group is electrically coupled to data line DIO via bit line BL in the selected column and corresponding read select gate RSG in the data read operation.

Read/write control circuit 30 further includes a data read circuit 100 and a data read current supply circuit 105.

Data read current supply circuit 105 has a current supply transistor 107 electrically coupled between power supply voltage Vcc and data line DIO. Current supply transistor 107 is formed of a P-channel MOS transistor receiving control signal /RE, which becomes active (L-level) in the data read operation. Current supply transistor 107 couples data line DIO to power supply voltage Vcc to produce data read current Is in the data read operation.

Data read current Is flows through a path extending from data line DIO, read select gate RSG in the selected column, bit line BL in the selected column, selected memory cell group (tunneling magneto-resistance elements TMR) and access transistor ATR to voltage line GL (fixed voltage Vss). In accordance with this current flow, a voltage corresponding to the electric resistance of the selected memory cell group including the selected memory cell occurs on data line DIO.

Data read circuit 100 further includes a switch circuit 110, voltage holding capacitors 111–113, sense amplifiers 120, 125 and 130, and a latch circuit 140.

Switch circuit 110 connects one node, which is successively selected from nodes N1–N3, to data line DIO in one data read operation. Voltage holding capacitors 111–113 are provided for holding voltages on nodes N1–N3, respectively.

Sense amplifier 120 amplifies and outputs a voltage difference between nodes N1 and N2. Sense amplifier 125 amplifies and outputs a voltage difference between nodes N1 and N3. Sense amplifier 130 amplifies and outputs a voltage difference between outputs of sense amplifiers 120 and 125. Latch circuit 140 latches an output voltage of sense amplifier 130 in accordance with predetermined timing, and outputs read data RD having a level corresponding to the storage data of the selected memory cell to node Nr.

Read data RD transmitted to node Nr is sent through an output buffer 170, and is output from a data output terminal 4a as output data DOUT. Input data DIN sent to a data input terminal 4b is transmitted to node Nw via input buffer 175.

As already described, switch circuit 160 connects node Nw to node N4 in the normal data write operation. In the data read operation, switch circuit 160 responds to an instruction sent from control circuit 5, and electrically couples node Nr to node N4 for rewriting read data RD into the selected memory cell.

The data read operation, which is performed according to the first embodiment by the read/write control circuit of the above structure, will now be described in greater detail.

Figure 6:
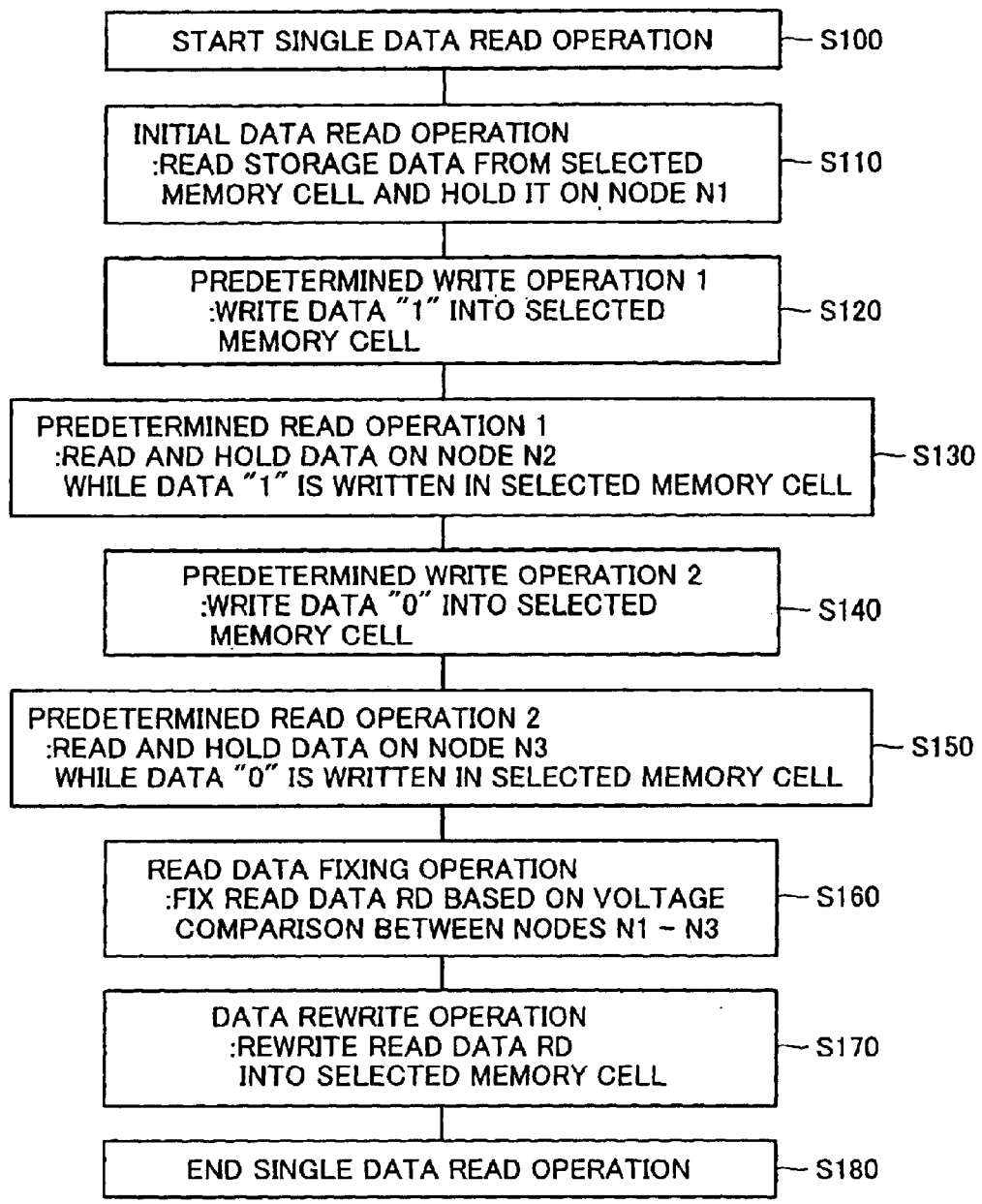
FIG. 6 is a flowchart illustrating a first data read operation for the memory array according to the first embodiment.

Referring to FIG. 6, when the structure according to the first embodiment starts a single data read operation (step S100), an initial data read operation is performed in the state, where the magnetization direction of the selected memory cell is the same as that before the data read operation, and thus, in the state where the selected memory cell holds the storage data to be read out. In the initial data read operation, the voltage on data line DIO, which may be merely referred to as the "data line voltage" hereinafter, is transmitted to and held on node N1 (step S110).

Then, a predetermined write operation 1 is performed by writing data at a predetermined level (e.g., of "1") into the selected memory cell. More specifically, the selected memory cell receives a data write magnetic field for writing the data at the predetermined level (step S120). Further, a predetermined read operation 1 is executed by reading data from the selected memory cell group in the state where the data at the predetermined level ("1") is already written into the selected memory cell. The data line voltage in this operation is held on node N2 (step S130).

Thereafter, a predetermined write operation 2 is performed by writing data at a level (e.g., of "0") different from that in the predetermined write operation 1 into the selected memory cell. Thus, the selected memory cell receives the data write magnetic field for writing the data at such a different level (step S140). Further, a predetermined read operation 2 is performed on the selected memory cell group in the state where the data of "0" is already written into the selected memory cell. The data line voltage in this operation is held on node N3 (step S150).

In each of the predetermined read operations 1 and 2, the write data level, which was forcedly set in the preceding predetermined write operation 1 or 2, may match with that of the storage data of the selected memory cell. In this case, the data line voltage in the predetermined read operation 1 or 2 is equal to that in the initial data read operation. Conversely, the data at the level different from that of the storage data in the selected memory cell may be forcedly written in the preceding predetermined write operation 1 or 2. In this case, the data line voltage in the subsequent predetermined read operation 1 or 2 rises or lowers from that in the initial data read operation.

When the predetermined read operation 2 is completed subsequently to the foregoing various operations, nodes N1, N2 and N3 hold the data line voltages, which appeared at the times of the initial data read operation, predetermined read operation 1 and predetermined read operation 2, respectively. In this state, read data RD representing the storage data read from the selected memory cell is fixed based on the comparison between the voltages on nodes N1–N3 (step S160). The data line voltage represents the level corresponding to the electric resistances of not only the selected memory cell but also the whole selected memory cell group. However, the comparison is made in data line voltage between the foregoing three read operations so that the storage data of the selected memory cell can be extracted and detected.

Further, read data RD is rewritten into the selected memory cell after read data RD is fixed (step S170). Thereby, the selected memory cell, which was subjected to the predetermined data writing in the read data sequence, can be processed to reproduce its storage data so that the state before the data reading can be reproduced.

Figure 7:
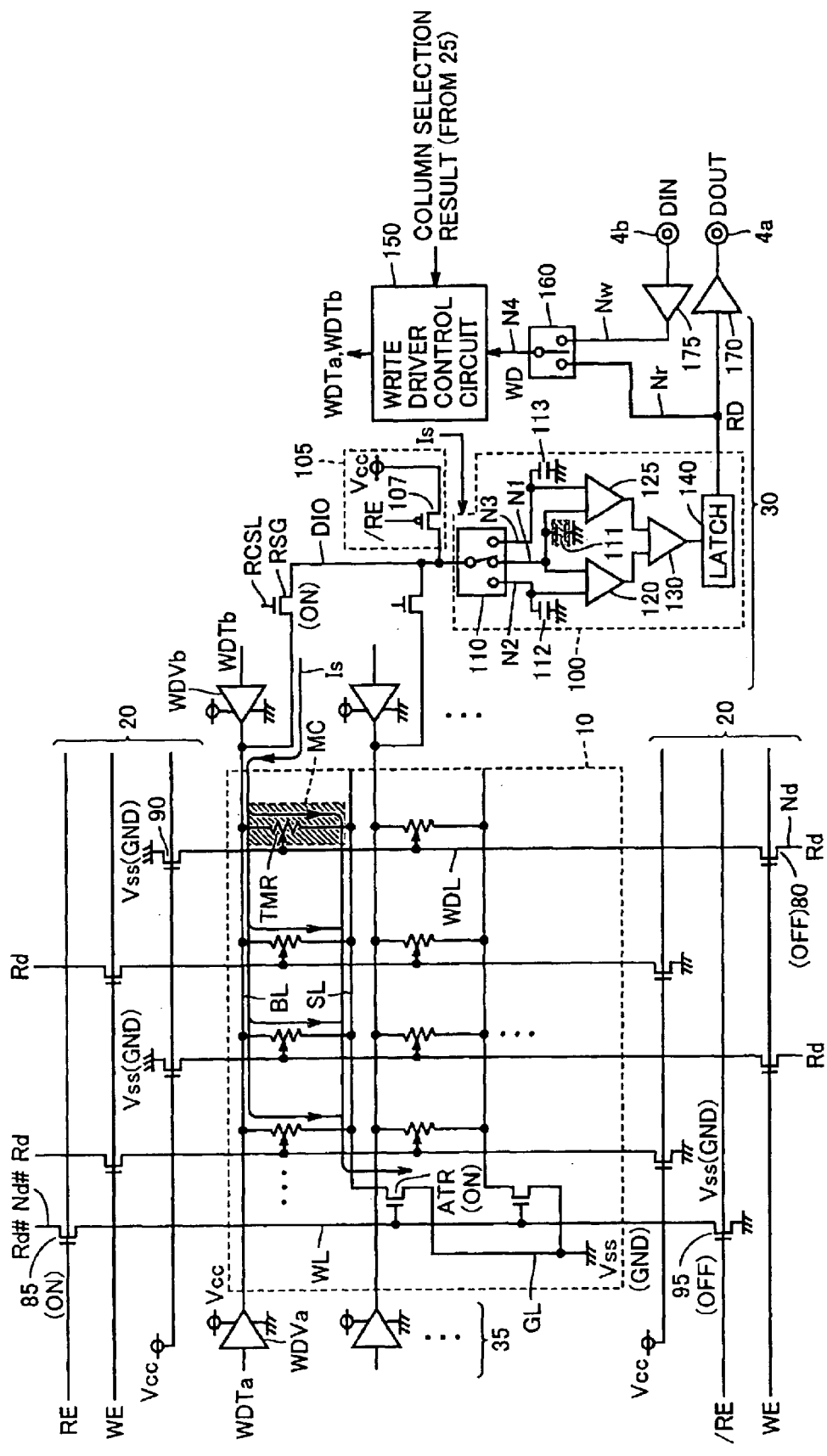
FIG. 7 is a circuit diagram showing an operation of a read/write control circuit in an initial data read operation.

Referring to FIG. 7, decode signal Rd corresponding to the selected row and decode signal Rd# corresponding to the selected row block are maintained at H-level during single data read operation. In the initial data read operation, control signal RE is set to H-level, and control signal WE is set to L-level. When the MTJ memory cell hatched in the figure is selected as the access target, corresponding word line WL and read column select line RCSL are activated to attain H-level. In accordance with this, corresponding read select gate RSG and access transistor ATR of the selected memory cell are turned on so that data read current Is passes through the plurality of tunneling magneto-resistance elements TMR, which form the selected memory cell group and are connected in parallel between corresponding bit line BL and strap SL.

Thereby, data line DIO bears a voltage corresponding to the storage data of the selected memory cell group in the state where the selected memory cell holds the original storage data. Switch circuit 110 connects data line DIO to node N1 in the initial data read operation. The voltage on node N1 is held by voltage holding capacitor 111.

Figure 8:
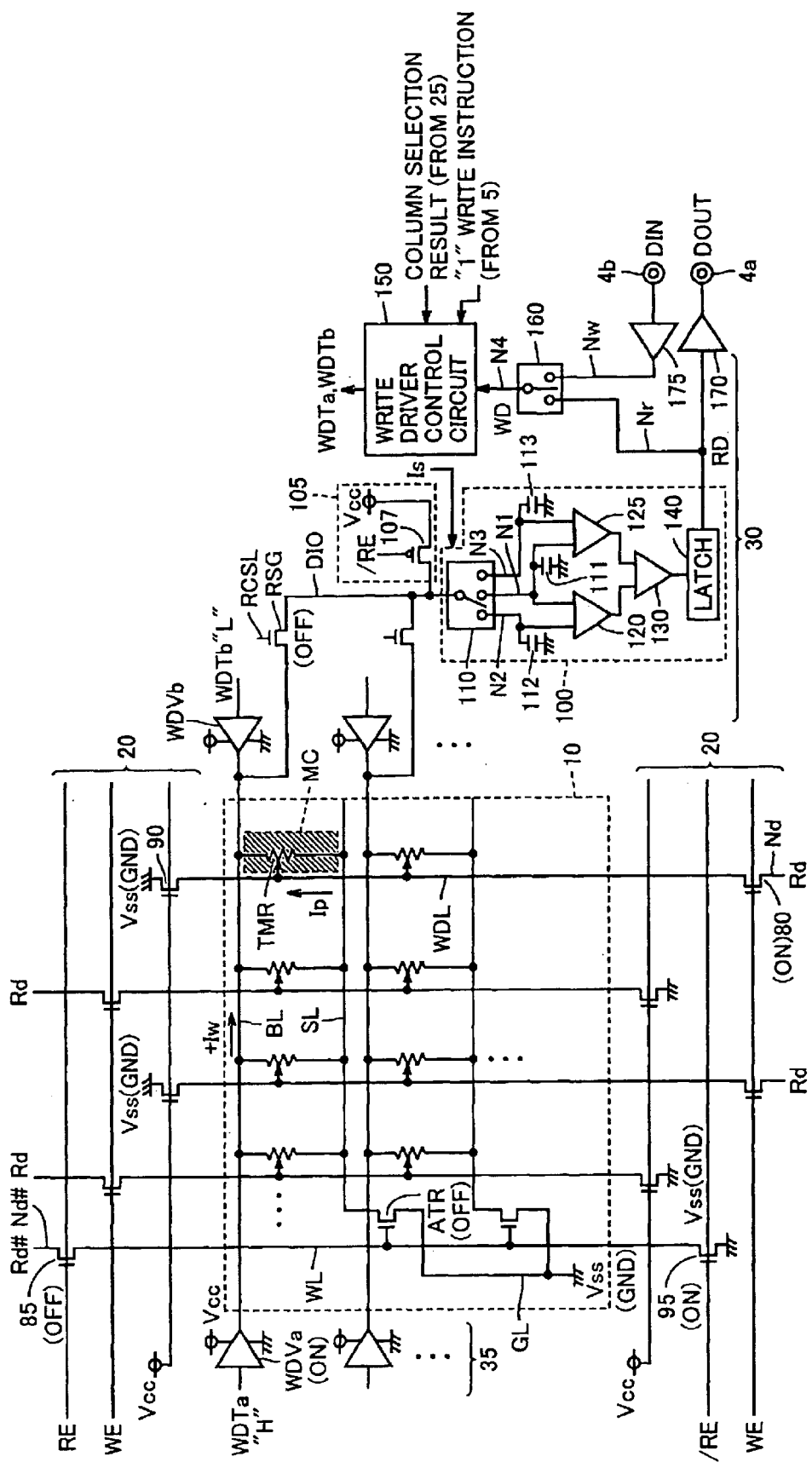
FIG. 8 is a circuit diagram showing an operation of the read/write control circuit in a predetermined write operation 1.

In predetermined write operation 1, as shown in FIG. 8, control signals RE and WE are set to L- and H-levels, respectively. Further, each read column select line RCSL is inactivated to attain L-level, and read select gate RSG in each memory cell column is turned off. Thereby, each bit line BL is isolated from data line DIO. Further, switch circuit 110 connects data line DIO to none of nodes N1–N3. For write driver control circuit 150, controller circuit 5 sends an operation instruction for writing data of "1".

Therefore, write digit line WDL in the selected row becomes active to carry data write current Ip. The bit line in the selected column carries data write current +Iw for writing the predetermined data ("1") in the direction from write driver WDVa to write driver WDVb.

Thus, write driver control circuit 150 sets write control signals WDTa and WDTb for the selected column to H- and L-levels in response to the write instruction sent from control circuit 5, respectively. Write control signals WDTa and WDTb for the other columns are all set to L-level. Thereby, data ("1") at the predetermined level is forcedly written into the selected memory cell. In contrast to this, no change occurs in storage data of the memory cells other than the selected memory cell.

Figure 9:
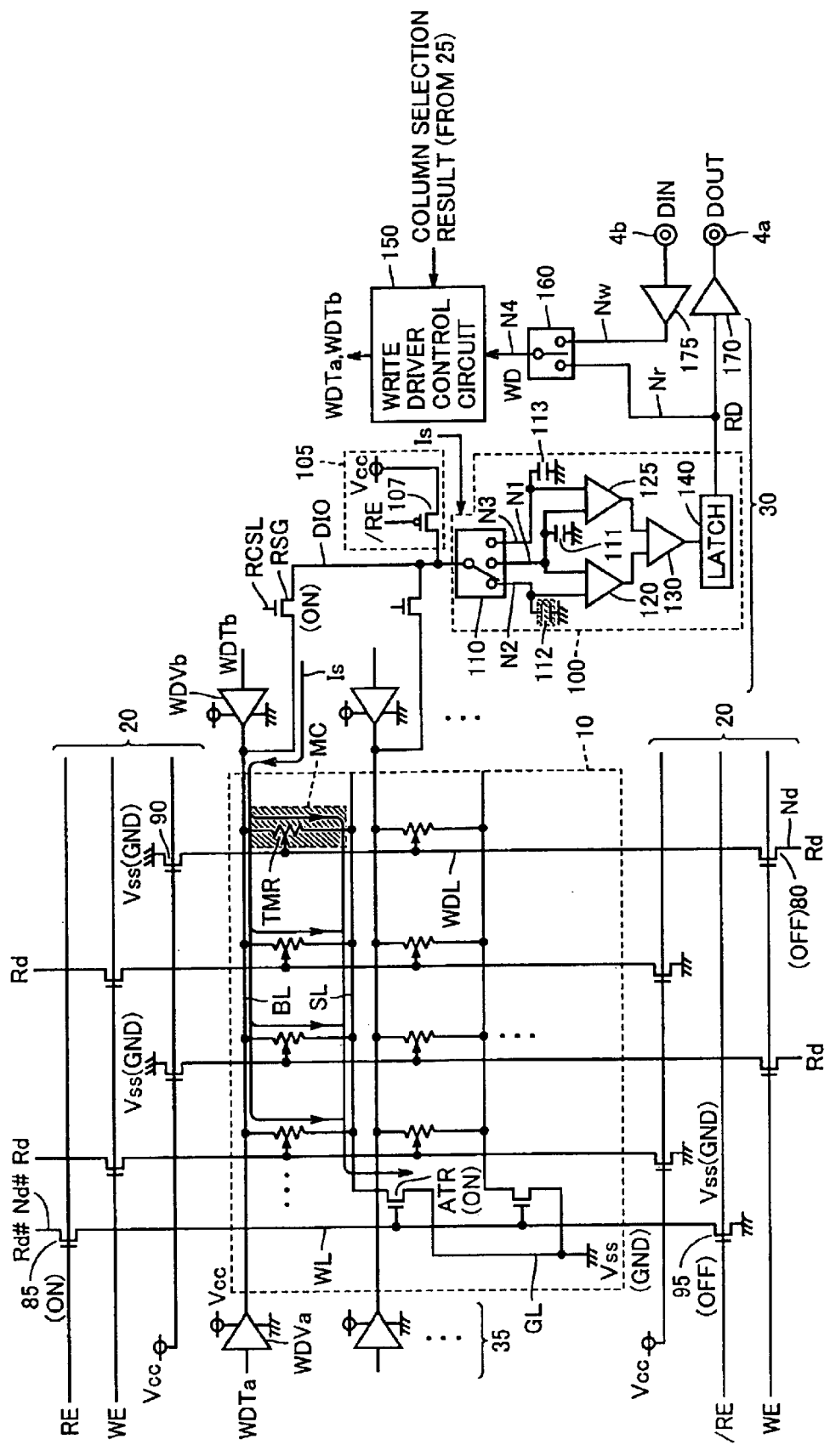
FIG. 9 is a circuit diagram showing an operation of the read/write control circuit in a predetermined read operation 1.

In predetermined read operation 1, as shown in FIG. 9, control signals RE and WE are set to H- and L-levels, respectively. Further, corresponding word line WL and read column select line RCSL are activated to attain H-level for reading data from the selected memory cell again. Switch circuit 110 connects data line DIO to node N2. The voltage on node N2 is held by voltage holding capacitor 112.

In the predetermined read operation 1 corresponding to a step S130 shown in FIG. 6, therefore, the data line voltage appearing in the state, where the selected memory cell stores the data of "1", is transmitted to and held on node N2.

Figure 10:
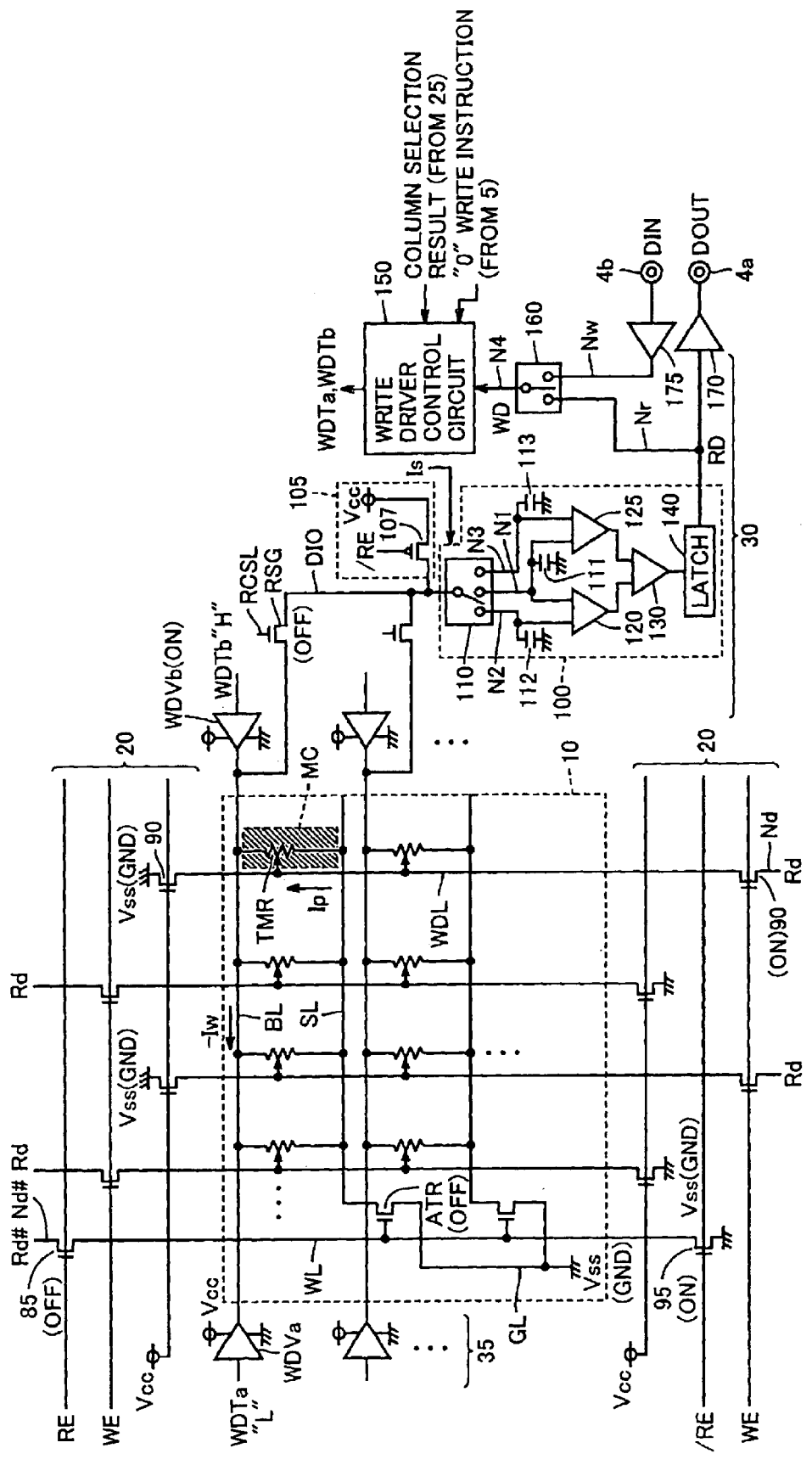
FIG. 10 is a circuit diagram showing an operation of the read/write control circuit in a predetermined write operation 2.

In predetermined write operation 2, as shown in FIG. 10, control signals RE and WE are set to L- and H-levels, respectively, and each bit line BL is isolated from data line DIO, similarly to predetermined write operation 1. Further, switch circuit 110 connects data line DIO to none of nodes N1–N3. To write driver control circuit 150, control circuit 5 issues an operation instruction for writing data of "0".

Accordingly, corresponding write digit line WDL is activated to carry data write current Ip. The bit line in the selected column carries data write current –Iw for writing such data ("0") in a direction from write driver WDVb to write driver WDVa.

Thus, write driver control circuit 150 sets write control signals WDTa and WDTb for the selected column to L- and H-levels in response to the write instruction sent from control circuit 5, respectively. Write control signals WDTa and WDTb for the other memory cell columns are all set to L-level. Thereby, data ("0") at the level different from that in predetermined write operation 1 is forcedly written into the selected memory cell. However, the no change occurs in storage data of the other memory cells belonging to the selected memory cell group, similarly to the predetermined write operation 1.

Figure 11:
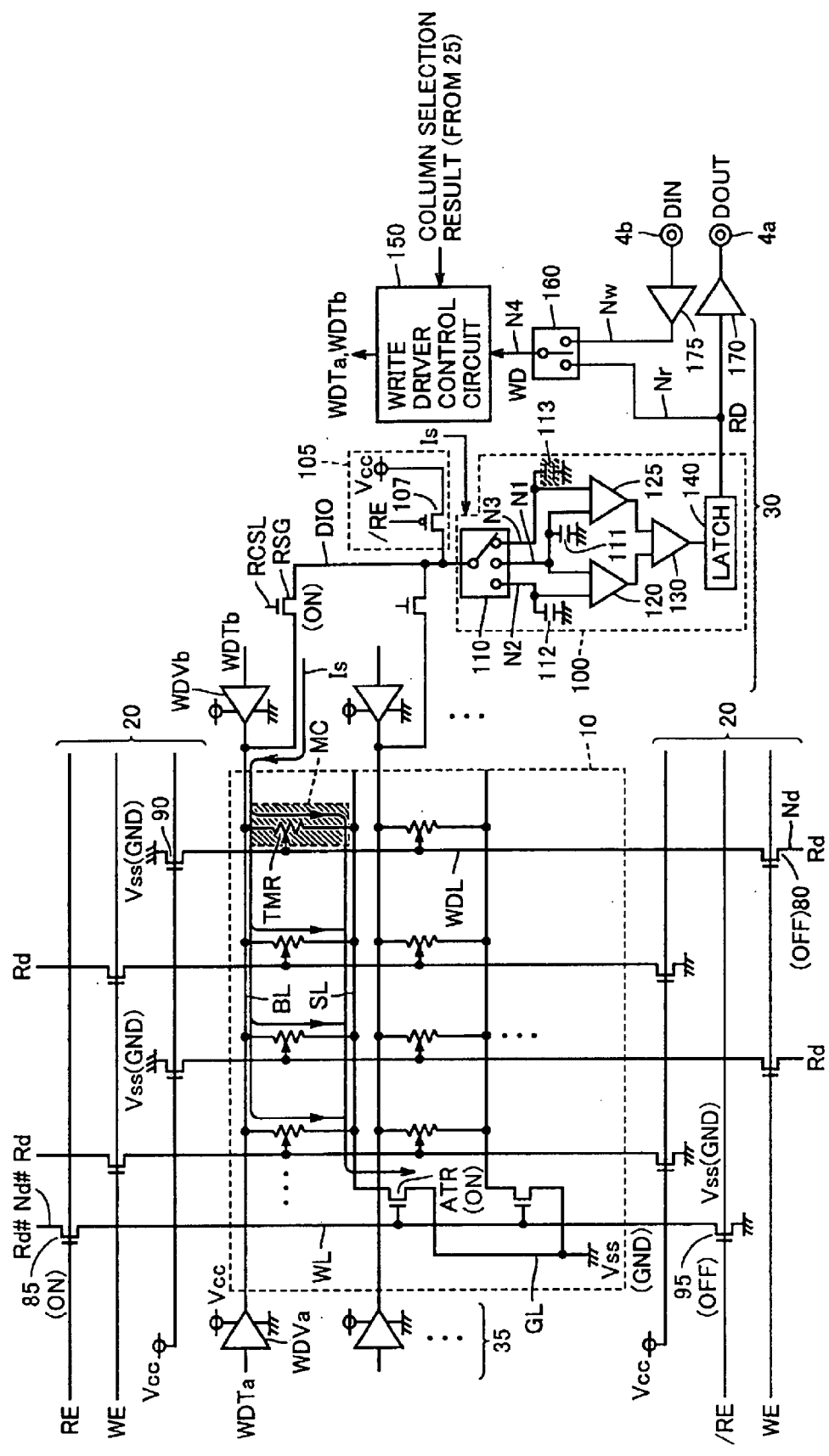
FIG. 11 is a circuit diagram showing an operation of the read/write control circuit in a predetermined read operation 2.

In predetermined read operation 2, as shown in FIG. 11, control signals RE and WE are set to H- and L-levels, respectively. For reading data from the selected memory cell again, corresponding word line WL and read column select line RCSL are activated to attain H-level. Further, switch circuit 110 connects data line DIO to node N3. The voltage on node N3 is held by voltage holding capacitor 113.

In predetermined read operation 2 corresponding to a step S150 shown in FIG. 6, the data line voltage appearing in the state, where the selected memory cell stores data of "0", is transmitted to and held on node N2.

When predetermined read operation 2 ends, nodes N1, N2 and N3 hold the data line voltages produced in the initial data read operation and the predetermined read operations 1 and 2 owing to voltage holding capacitors 111–113, respectively.

Accordingly, one of sense amplifier 120 and 125 receives on its two inputs the voltages at the same level, respectively, so that the output thereof is hardly amplified. In the other sense amplifier, an output voltage is amplified to a large extent. More specifically, when the storage data of the selected memory cell is "1", the output of sense amplifier 120 is hardly amplified, but the output of sense amplifier 125 is amplified to have a full amplitude. Conversely, when the storage data of selected memory cell is "0", the output of sense amplifier 125 is hardly amplified, but the output of sense amplifier 120 is amplified to have a full amplitude.

Sense amplifier 130 in the second stage produces a voltage corresponding to the storage data of the selected memory cell in accordance with a comparison between the output voltages of sense amplifiers 120 and 125 in the first stage. The output of sense amplifier 130 is held by latch circuit 140 in accordance with timing corresponding to the read data fixing operation in a step S160 shown in FIG. 6. Latch circuit 140 produces read data RD, which corresponds to the held voltage, on node Nr.

Figure 12:
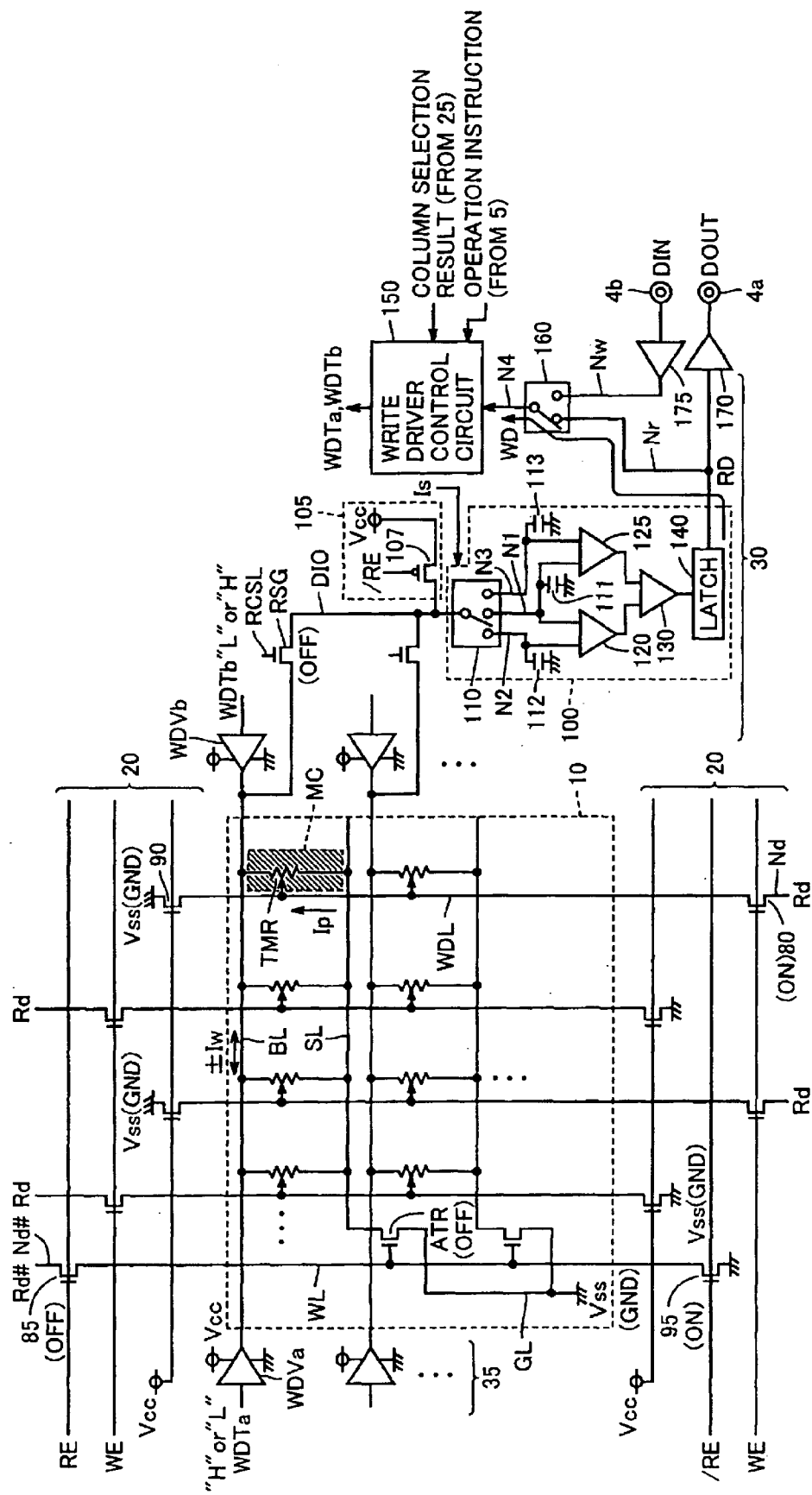
FIG. 12 is a circuit diagram showing an operation of the read/write control circuit in a data rewrite operation.

In a data rewrite operation, as shown in FIG. 12, read data RD is rewritten into the selected memory cell, which was subjected to the forced data writing. Switch circuit 160 connects nodes Nr and N4 together. To write driver control circuit 150, control circuit 5 issues an operation instruction for executing the rewrite operation.

Accordingly, write driver control circuit 150 sets corresponding write control signals WDTa and WDTb to the levels such that data write current +Iw or –Iw in the direction corresponding to the level of read data RD may flow through bit line BL in the selected column. Likewise, control signal WE is turned on, and data write current Ip flows through write digit line WDL in the selected row.

Thereby, read data RD, which corresponds to the data stored in the selected memory cell before the data read operation, is rewritten into the selected memory cell so that the state of the selected memory cell returns to the state before the data read operation.

Figure 13:
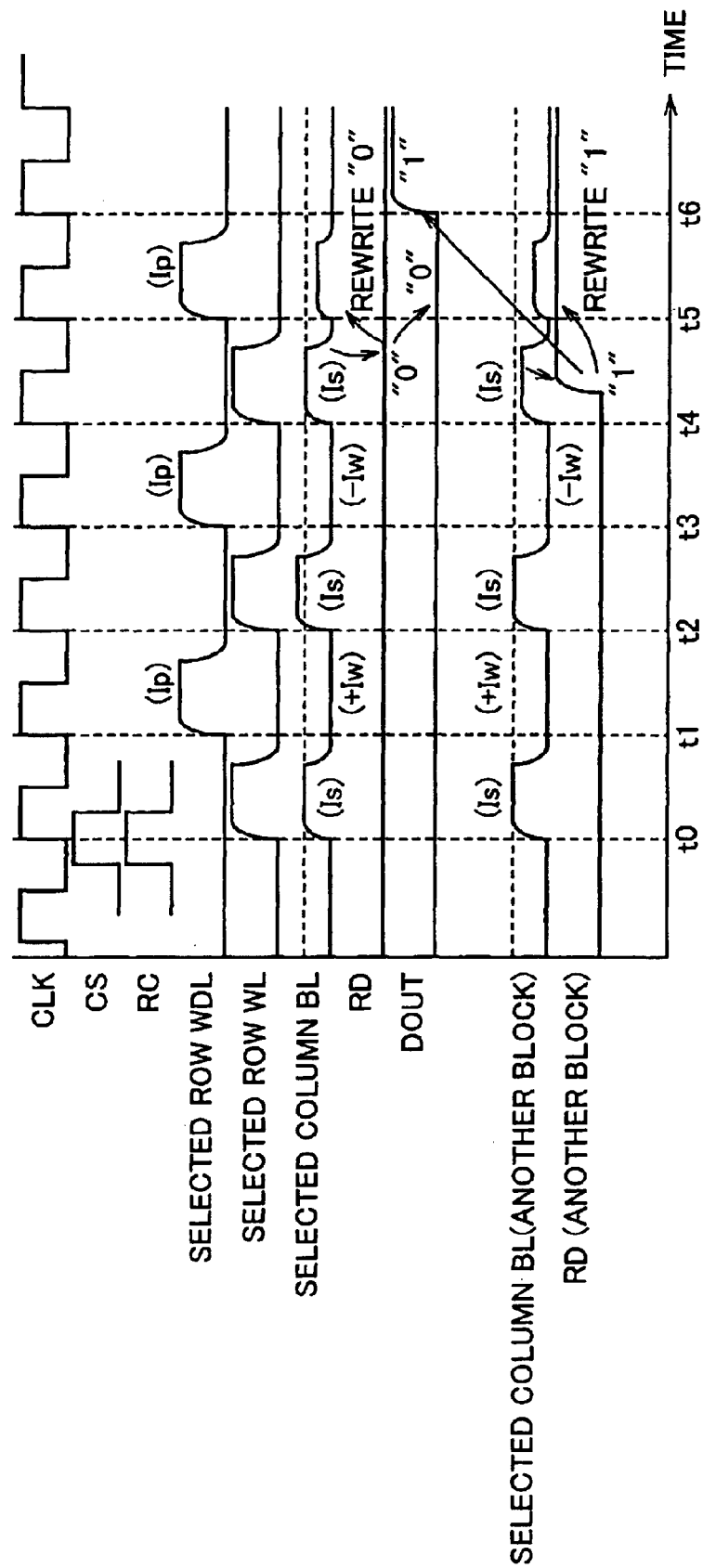
FIG. 13 is an operation waveform diagram illustrating a data read operation for the memory array according to the first embodiment.

FIG. 13 is an operation waveform diagram showing a data read operation for the memory array according to the first embodiment.

Referring to FIG. 13, each of operations forming single data read operation shown in FIG. 6 can be executed, e.g., in synchronization with a clock signal CLK.

More specifically, the device takes in a chip select signal CS and a read command RC at a time t0 corresponding to an activation edge of clock signal CLK. Thereby, the initial data read operation is executed. In the initial data read operation, word line WL in the selected row is activated, and bit line BL in the selected column is supplied with data read current Is. The voltage caused on data line DIO by data read current Is, i.e., the data line voltage appearing in the state, where the selected memory cell holds the original storage data, is transmitted to and held on node N1.

At a subsequent time t1 corresponding to the clock activation edge, predetermined write operation 1 is executed. Thereby, data write current Ip flows through write digit line WDL in the selected row, and data write current +Iw flows through bit line BL in the selected column so that data ("1") at the predetermined level is forcedly written into the selected memory cell.

At a time t2 corresponding to the next clock activation edge, predetermined read operation 1 is executed. Thus, data read current Is is supplied to bit line BL in the selected column while word line WL in the selected row is active. The voltage caused on data line DIO by data read current Is, i.e., the data line voltage appearing in the state, where the selected memory cell holds data of "1", is transmitted to and held on node N2.

Then, predetermined write operation 2 starts at a time t3 corresponding to the next clock activation edge. Thereby, write digit line WDL in the selected row carries data write current Ip, and bit line BL in the selected column carries data write current −Iw so that data ("0") at the level different from that in predetermined write operation 1 is forcedly written into the selected memory cell.

Further, predetermined read operation 2 starts at a time t4 corresponding to the next clock activation edge. Thus, data read current Is is supplied to bit line BL in the selected column while word line WL in the selected row is active. The data line voltage appearing in the state, where the selected memory cell holds data of "0", is transmitted to and held on node N3.

By the execution of predetermined read operation 2, nodes N1, N2 and N3 hold the data line voltages corresponding to the states, where the selected memory cell holds the storage data, data "1" and data "0", respectively. Therefore, read data RD can be produced based on the voltages on nodes N1–N3.

At a time t5 corresponding to the next clock activation edge, output data DOUT corresponding to read data RD is output from data output terminal 4a. In parallel with this, rewriting of the data is executed on the selected memory cell. More specifically, write digit line WDL in the selected row carries data write current Ip, and bit line BL in the selected column carries data write current +Iw or −Iw depending on the level of read data RD. Thereby, the data at the same level as read data RD is written into the selected memory cell so that the selected memory cell returns to the state similar to that before the data read operation.

The MRAM device may be formed of a plurality of blocks each formed of the structure, which is shown in FIG. 5 and is provided for reading and writing data of one bit. FIG. 13 also illustrates a data read operation of the device formed of such blocks.

In the MRAM device having the plurality of blocks, the data read operations each performed in accordance with a flow illustrated in FIG. 6 are effected in parallel in the respective blocks. In the other blocks having substantially the same structure as that in FIG. 5, the data read operations are performed similarly to that of the structure in FIG. 5, and each block produces read data RD from the selected memory cell at time t4.

According to the above structure, read data RD can be output as output data DOUT in a burst fashion from the respective blocks at and after a time t5 corresponding to the next clock activation edge. At time t5 in FIG. 13, "0" is output as output data DOUT corresponding to read data RD of one of the blocks. At a time t6 corresponding to the next clock activation edge, "1" is output as output data DOUT corresponding to read data RD of another block.

FIG. 13 shows the manner, in which the respective operations forming single data read operation are executed in response to the activation edges of clock signal CLK. However, the invention is not restricted to this. In response to clock signal CLK, a timing control signal may be internally produced, and single data read operation shown in FIG. 6 may be executed in response to this timing control signal during one clock cycle of clock signal CLK. The number of clock cycles (clock signal CLK) required for the single data read operation can be appropriately determined depending on a time required for the single data read operation and an operation clock, i.e., a frequency of clock signal CLK.

In the memory array of the structure according to the first embodiment, since the access transistor ATR is shared, the data read current flows in parallel through the plurality of tunneling magneto-resistance elements TMR (selected memory cell group) as described above. However, the data read operations are performed before and after writing the predetermined data into the selected memory cell, and a comparison is made between the data line voltages caused by these data read operations. Thereby, the storage data of one selected memory cell included in the selected memory cell group can be extracted and detected.

Further, the data read operation for the selected memory cell can be executed only by accessing the selected memory cell group without using a reference cell. Thus, the data reading is executed in the self-reference manner based on the comparison, which is made between the voltages on the same data read path including the same memory cell, the same bit line, the same data line, the same sense amplifier and others.

Consequently, it is possible to avoid influences of offset and others, which may be caused by variations in manufacturing of various circuits forming the data read path, and thereby the precision of the data read operation can be improved. Thus, the data reading from the selected memory cell can be performed without making a comparison with respect to another memory cell such as a reference cell or with respect to a data read circuit system including such a reference cell or the like, and the data reading can be precisely performed without influences by variations in manufacturing. Since the reference cell is not required, all the MTJ memory cells can be configured to store the data, and can be used as effective bits.

Modification of the First Embodiment

Figure 14:
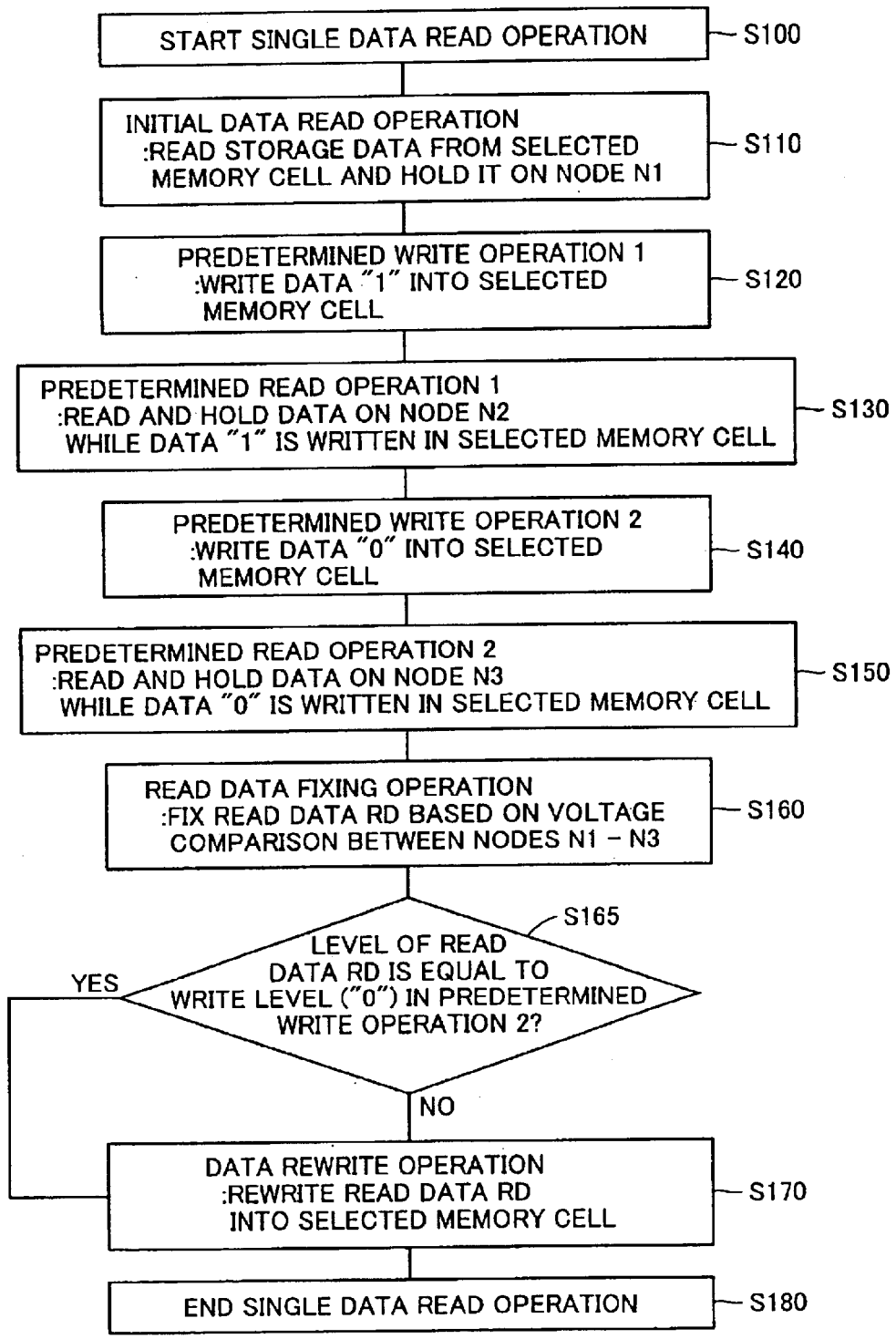
FIG. 14 is a flowchart illustrating one data read operation according to a modification of the first embodiment.

FIG. 14 is a flowchart illustrating single data read operation according to a modification of the first embodiment.

Referring to FIG. 14, the data read operation according to the modification of the first embodiment differs from that in the flowchart of FIG. 6 in that a step 165 of determining whether the data rewrite operation is required or not is additionally employed between step S160 of fixing the read data and a step S170 of executing the data rewrite operation.

In step S165, it is determined whether read data RD fixed in step S160 is the same as the data ("0") written by predetermined write operation 2 or not. If these data are at the same level, the data stored in the selected memory cell is already at the same level as the data (read data RD) to be rewritten in subsequent step S170 when the data rewrite operation is not yet performed. Therefore, it is not necessary to execute the data rewriting.

As described above, if the data stored in the selected memory cell is at the same level as fixed read data RD before the data rewrite operation, the data rewrite operation in step S170 is skipped, and one data read operation ends (step S180). When these data are at different levels, respectively, the data rewrite operation is executed in step S170, similarly to the first embodiment. Consequently, an unnecessary rewrite operation can be eliminated, and the current consumption in the data read operation can be reduced.

In the first embodiment and the modification thereof, which have been described by way of example, "1" and "0" are forcedly written in predetermined write operations 1 and 2, respectively. However, the data levels in these operations may be inverted. Thus, data of "0" may be written in predetermined write operation 1, and data of "1" may be written in predetermined write operation 2.

In the first embodiment and the modification thereof, which have been described by way of example, each of the predetermined write operation and the predetermined read operation is performed two times corresponding to two kinds of data levels of "1" and "0", and these two predetermined write operations and two predetermined read operations are executed in the single data read operation. However, the device may be configured to execute only one predetermined write operation and only one predetermined read operation, each of which corresponds to only one of the data levels, in one data read operation.

In this case, such a structure is employed that read data RD is produced based on whether a voltage difference at a predetermined level or higher is present between the data line voltage in the initial data read operation and the data line voltage in the predetermined read operation performed after the predetermined write operation, or not. For example, in data read circuit 100 shown in FIG. 5, voltage holding capacitor 113 and sense amplifier 125 for node N3 are eliminated, and a reference voltage at an intermediate level is supplied on one of the inputs of sense amplifier 130. Thereby, the above data reading can be executed. This can reduce the number of parts of data read circuit 100, and therefore can reduce the required area and cost.

Second Embodiment

A second embodiment will now be described in connection with a structure for performing data reading in a self-reference manner with a data read circuit, which has a structure further simplified as compared with that in the memory array structure of the first embodiment.

Figure 15:
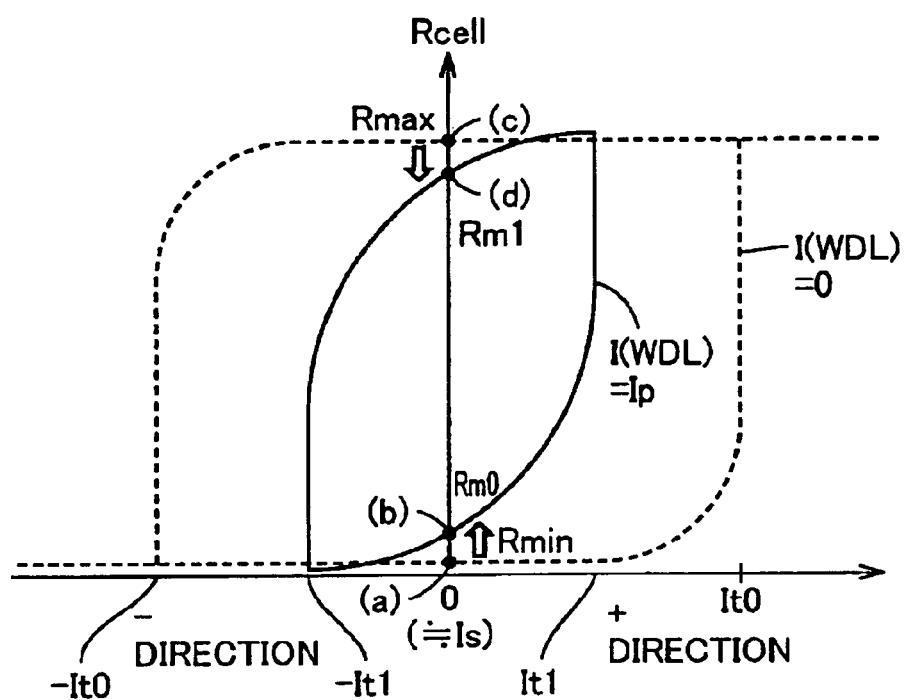
FIG. 15 conceptually shows principles of the data read operation according to a second embodiment.

FIG. 15 illustrates a relationship (hysteresis characteristics) between the data write current supplied to the MTJ memory cell and the electric resistance of the MTJ memory cell.

Referring to FIG. 15, an abscissa indicates a bit line current I(BL) flowing through the bit line, and an ordinate indicates an electric resistance Rcell of the MTJ memory cell. A magnetic field produced by bit line current I(BL) acts along the easy axis (EA) in free magnetic layer VL of the MTJ memory cell. The magnetic field produced by a digit line current I(WDL) flowing through write digit line WDL acts along the hard axis (HA) in free magnetic layer VL.

When bit line current I(BL) exceeds a threshold of inverting the magnetization direction of free magnetic layer VL, the magnetization direction of free magnetic layer VL is inverted, and memory cell resistance Rcell changes. In FIG. 15, memory cell resistance Rcell attains maximum value Rmax when bit line current I(BL) in the positive (+) direction exceeds the threshold. When bit line current I(BL) in the negative (−) direction exceeds the threshold, memory cell resistance Rcell attains minimum value Rmin. The threshold of bit line current I(BL) depends on current I(WDL) flowing through write digit line WDL.

In FIG. 15, dotted line represents hysteresis characteristics of memory cell resistance Rcell, which appears when digit line current I(WDL) flowing through write digit line WDL is equal to zero. In this case, it is assumed that the thresholds of bit line current I(BL) in the positive and negative directions are equal to Ito and −Ito, respectively.

Conversely, when a current flows through write digit line WDL, the threshold of bit line current I(BL) lowers. When digit line current I(WDL) is equal to Ip, memory cell resistance Rcell exhibits the hysteresis characteristics depicted by solid line in FIG. 15. Due to the influence by the magnetic field, which is caused in the hard axis direction by digit line current I(WDL), the thresholds of bit line current I(BL) in the positive and negative directions change into It1 smaller than It0 and −It1 larger than −It0, respectively. These hysteresis characteristics represent variations in memory cell resistance Rcell during the data write operation.

Accordingly, the bit line current I(BL) in the data write operation and thus data write currents +Iw and −Iw are set to satisfy relationships of (It1<+Iw<It0) and (−It0<−Iw<−It1).

In the data read operation, bit line current I(BL) and thus data read current Is flow as a charging current of data line DIO, to which the selected memory cell, parasitic capacitance and others are connected as R-C loads. Therefore, these bit line current I(BL) and data read current Is are generally smaller in level by two or three digits than bit line current I(BL) in the data write operation and thus data write currents ±Iw. Accordingly, it can be deemed in FIG. 15 that data read current Is is approximately equal to zero.

Before the data reading, the magnetization direction of the free magnetic layer in tunneling magneto-resistance element TMR is set to attain the state where the selected memory cell has electric resistance Rmin or Rmax as shown by (a) or (c) in FIG. 15.

Figure 16:
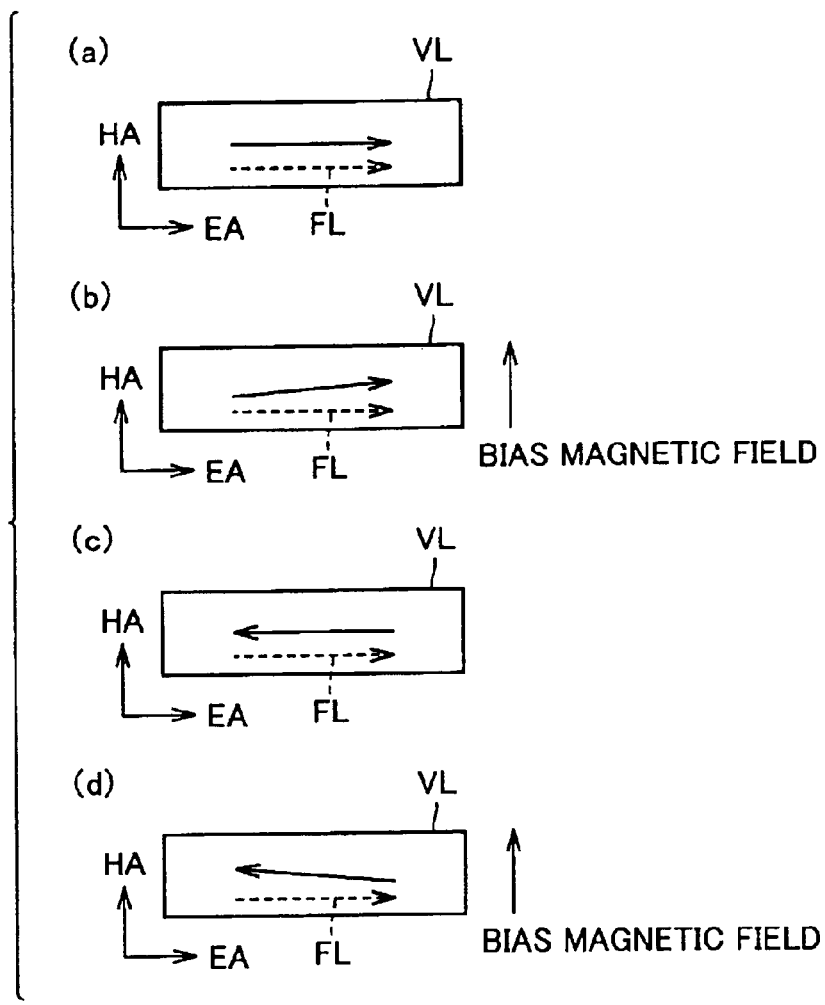
FIG. 16 conceptually shows a magnetization direction of a tunneling magneto-resistance element in respective states shown in FIG. 15.

FIG. 16 conceptually illustrates the magnetization directions of the tunneling magneto-resistance element in the respective states shown in FIG. 15.

In FIG. 16, (a) represents the magnetization direction in the state represented by (a) in FIG. 15. In this state, the magnetization direction of free magnetic layer VL is parallel to the magnetization direction of fixed magnetic layer FL so that memory cell resistance Rcell is set to minimum value Rmin.

In FIG. 16, (c) represents the magnetization direction in the state represented by (c) in FIG. 15. In this state, the magnetization direction of free magnetic layer VL is parallel and opposite (anti-parallel) to the magnetization direction of fixed magnetic layer FL so that memory cell resistance Rcell is set to maximum value Rmax.

When a predetermined current (e.g., data write current Ip) flows through write digit line WDL, the magnetization direction of free magnetic layer VL is turned to a certain extent, although it is not fully inverted. Therefore, electric resistance Rcell of tunneling magneto-resistance element TMR changes.

Subsequent to the magnetized state at (a) in FIG. 16, digit line current I(WDL) may further apply a predetermined bias magnetic field in the direction of hard axis (HA) as shown at (b) in FIG. 16. In this case, the magnetization direction of free magnetic layer VL turns to a certain extent, and forms a predetermined angle with respect to the magnetization direction of fixed magnetic layer FL. Thereby, memory cell resistance Rcell rises from minimum value Rmin to Rm0 in the magnetized state corresponding to (b) in FIG. 16.

Likewise, when a similar predetermined bias magnetic field is further applied in the magnetized state at (c) in FIG. 16, the magnetization direction of free magnetic layer VL turns to a certain extent to form a predetermined angle with respect to the magnetization direction of fixed magnetic layer FL. Thereby, memory cell resistance Rcell lowers from maximum value Rmax to Rm1 in the magnetized state corresponding to (d) in FIG. 16.

As described above, application of the bias magnetic field along hard axis (HA) lowers memory cell resistance Rcell of the MTJ memory cell, which stores data corresponding to maximum value Rmax, and raises memory cell resistance Rcell of the MTJ memory cell, which stores the data corresponding to minimum value Rmin.

As described above, by applying the bias magnetic field along the hard axis to the MTJ memory cell bearing certain storage data, the change in electric resistance of the polarity corresponding to the storage data can be caused in memory cell resistance Rcell. Thus, the change occurs in memory cell resistance Rcell in response to application of the bias magnetic field, and this change occurs in different polarities depending on the level of the storage data. In the second embodiment, the data reading is executed utilizing such magnetic characteristics of the MTJ memory cells.

Figure 17:
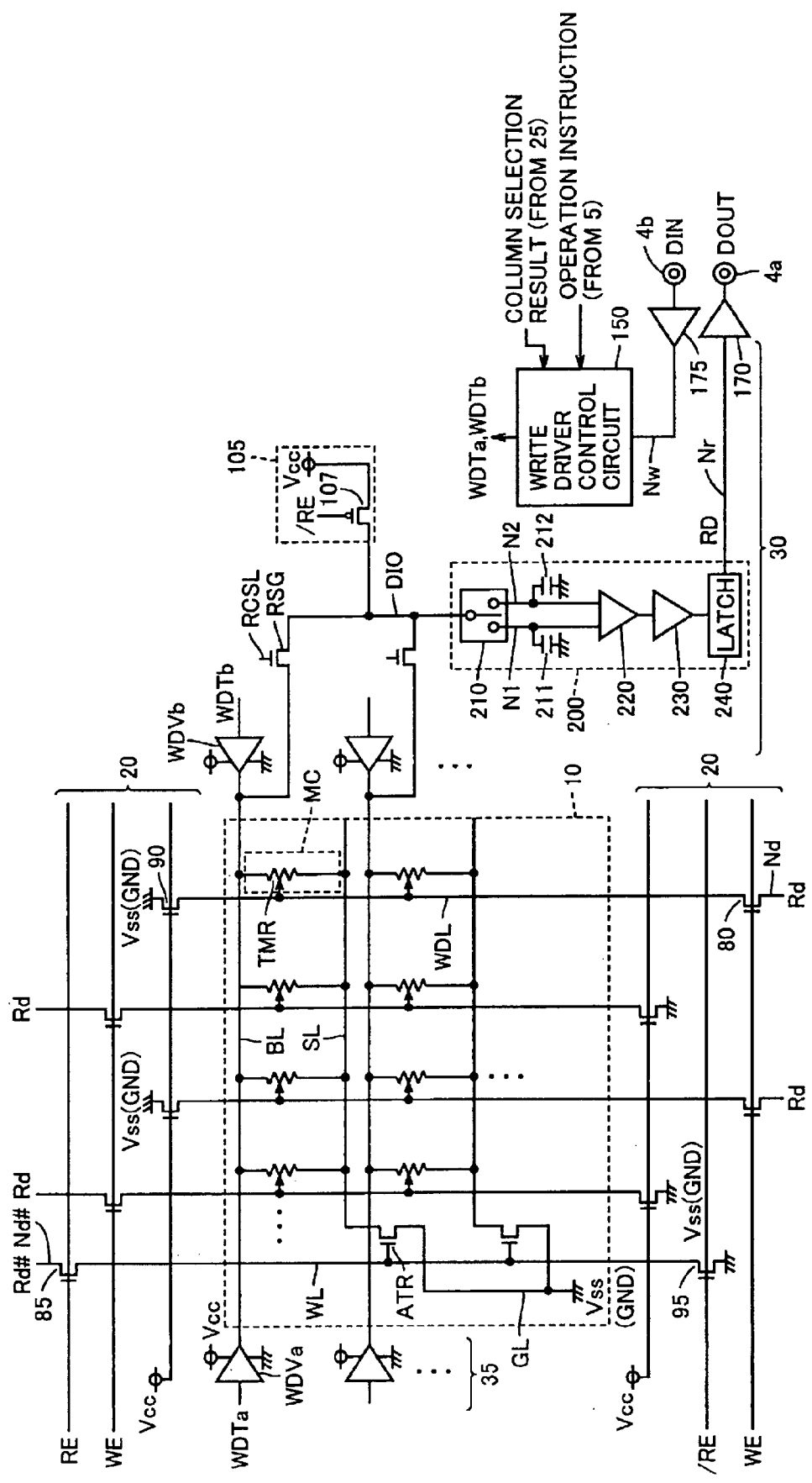
FIG. 17 is a circuit diagram showing a structure of a read/write control circuit according to the second embodiment.

Referring to FIG. 17, the structure according to the second embodiment differs from the structure according to the first embodiment shown in FIG. 2 in that read/write control circuit 30 includes a data read circuit 200 instead of data read circuit 100, and that switch circuit 160 is not employed. Structures of memory array 10 and others are substantially the same as those of the first embodiment, and therefore, description thereof is not repeated.

Data read circuit 200 includes a switch circuit 210 arranged between data line DIO and nodes N1 and N2, voltage holding capacitors 211 and 212 provided corresponding to nodes N1 and N2, respectively, sense amplifiers 220 and 230, and a latch circuit 240.

Switch circuit 210 connects one node, which is successively selected from nodes N1 and N2, to data line DIO in single data read operation. Voltage holding capacitors 211 and 212 are provided for holding the voltages on nodes N1 and N2, respectively.

Sense amplifier 220 amplifies the voltage difference between nodes N1 and N2. Sense amplifier 230 in the second stage further amplifies the output of sense amplifier 220, and transmits it to latch circuit 240. Latch circuit 240 amplifies the output, which is issued from sense amplifier 230 in accordance with predetermined timing, to attain a full amplitude, and latches it. Thereby, latch circuit 240 outputs read data RD at the level corresponding to the storage data of the selected memory cell to node Nr.

The single data read operation according to the second embodiment is formed of a first read operation corresponding to the initial data read operation in the first embodiment as well as a second read operation, which is executed while passing a bias current through write digit line WDL in the selected column. In particular, data write current Ip, which flows through write digit line WDL during the data writing, may be used as the bias current thus passed. In this case, it is not necessary to arrange a new circuit for supplying the bias current during the data reading so that the circuit structure can be simple.

In the first read operation, a current does not flow through write digit line WDL corresponding to the selected memory cell (I(WDL)=0), and thus the magnetization direction of the selected memory cell is similar to that before the data read operation. In this state, the data reading of the first read operation is effected on the selected memory cell group coupled to the common strap. Switch circuit 210 connects data line DIO to node N1. Thereby, the data line voltage in the first read operation is held on node N1 by voltage holding capacitor 211.

In the second read operation, the bias current flows through write digit line WDL corresponding to the selected row (I(WDL)=Ip), and thus the selected memory cell is subjected to the predetermined bias magnetic field along the hard axis. In this state, the data reading of the second read operation is effected on the selected memory cell group.

In the second data read operation, switch circuit 210 connects data line DIO to node N2. Therefore, the data line voltage in the second data read operation is transmitted to node N2, and is held by voltage holding capacitor 212.

By applying the bias magnetic field as already described, memory cell resistance Rcell of the selected memory cell changes with the polarity corresponding to the storage data level in the first read operation, and thus, before the data read operation. Thereby, the voltage on data line DIO in the second read operation rises or lowers with respect to that in the first read operation in accordance with the storage data of the selected memory cell.

More specifically, when storage data, e.g., of "1" corresponding to electric resistance Rmax is stored in the selected memory cell, the data line voltage in the second read operation is higher than that in the first read operation. This is because the passing currents of the selected memory cell group increase as the bias magnetic field caused by digit line current I(WDL) decreases memory cell resistance Rcell of the selected memory cell. Conversely, when the storage data, e.g., of "0" corresponding to electric resistance Rmin is stored in the selected memory cell, the data line voltage in the second read operation is lower than that in the first read operation. This is because the passing current of the selected memory cell group decreases as the bias magnetic field caused by digit line current I(WDL) increases memory cell resistance Rcell of the selected memory cell.

Sense amplifier 220 makes a comparison between voltages, which are held on nodes N1 and N2, respectively, and thus between data line voltages in the first and second read operations. After execution of the second read operation, latch circuit 240 amplifies and latches the output of sense amplifier 230, which amplifies the output of sense amplifier 220, to produce read data RD so that read data RD has a level corresponding to the storage data of the selected memory cell.

As described above, the structure of the second embodiment does not require a predetermined write operation for forcedly writing the storage data at the predetermined level, and naturally does not require a predetermined read operation following the same, in contrast to the structure according to the first embodiment.

The magnetic field, which is applied to the selected memory cell by the bias current (data write current Ip) flowing through write digit line WDL, does not invert the magnetization direction of tunneling magneto-resistance element TMR. Accordingly, the magnetization direction of the selected memory cell returns to the same state as that before the data read operation when the bias magnetic field disappears. Therefore, the data rewrite operation similar to that in the first embodiment is not required in the single data read operation.

Consequently, write driver control circuit 150 operates in response to the instruction of control circuit 5 and in accordance with only the write sequence of the data write operation. Switch circuit 160 for transmitting read data RD to write driver control circuit 150 is not required, and write driver control circuit 150 is merely required to produce write control signals WDTa and WDTb based on input data DIN sent to data input terminal 4b.

Figure 18:
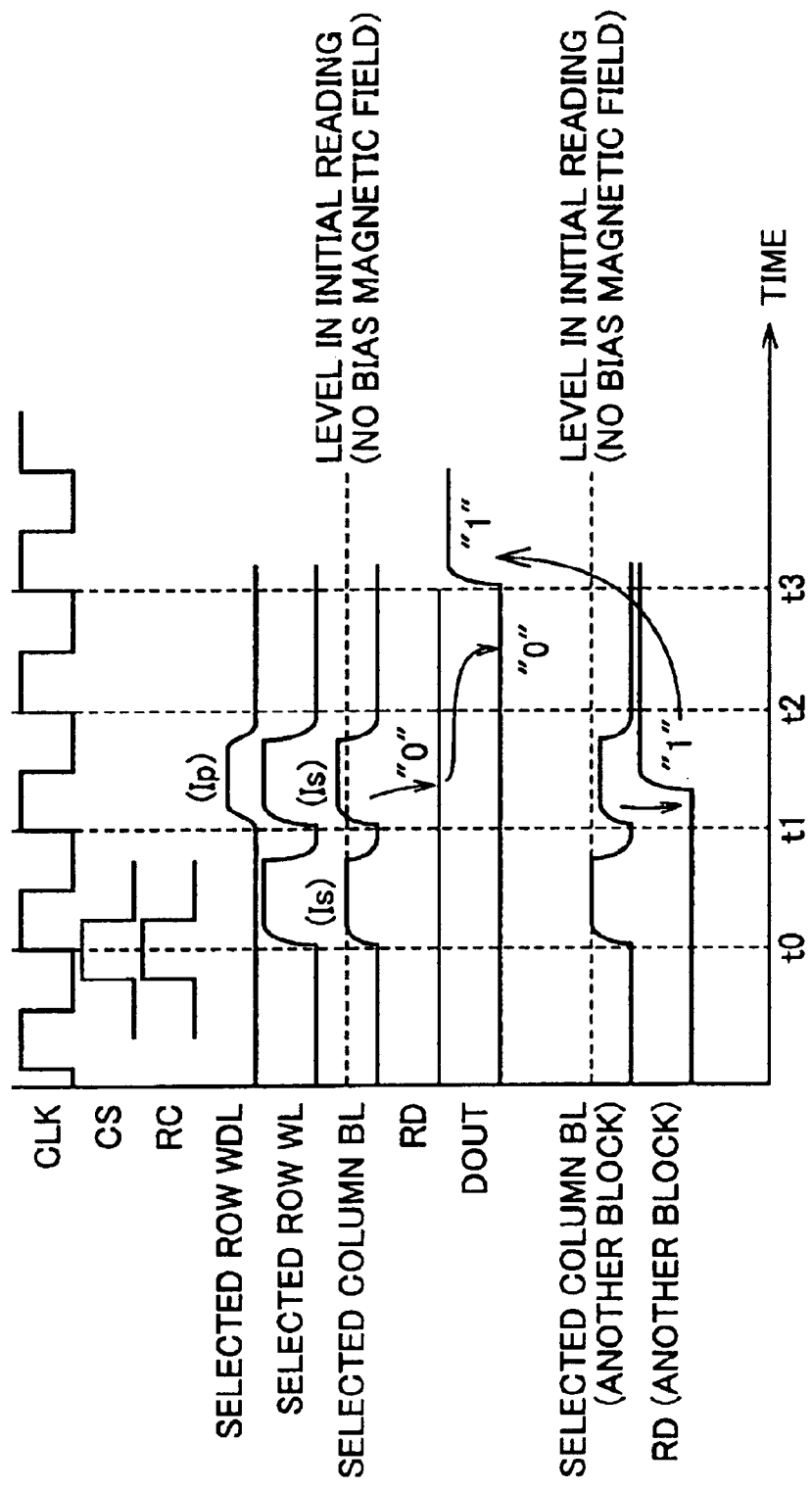
FIG. 18 is an operation waveform diagram illustrating a data read operation according to the second embodiment of the invention.

FIG. 18 is an operation waveform diagram illustrating the data read operation according to the second embodiment.

Referring to FIG. 18, the single data read operation according to the second embodiment can be executed, e.g., in synchronization with clock signal CLK.

More specifically, when the device takes in chip select signal CS and read command RC at time t0 corresponding to the activation edge of clock signal CLK, it performs the first read operation corresponding to the initial data read operation. In the first read operation, word line WL in the selected row block is activated, and data read current Is is supplied to bit line BL in the selected column. In the state where the voltage caused on data line DIO by data read current Is and thus the magnetization direction of the selected memory cell are the same as those before the data read operation, the data line voltage, which appears when data read current Is flows through the selected memory cell group, is transmitted to and held on node N1.

Then, the second read operation starts at time t1 corresponding to the next clock activation edge. Thus, in the state where a bias current substantially equal to data write current Ip flows through write digit line WDL in the selected row, word line WL in the selected row is activated, and data read current Is is supplied to bit line BL in the selected column. Consequently, node N2 receives and holds the data line voltage, which appears when data read current Is passes through the selected memory cell group while the selected memory cell is being subjected to the predetermined bias magnetic field. Accordingly, in and after the second read operation, read data RD can be produced based on the comparison between voltages on nodes N1 and N2.

At and after time t2 corresponding to the next clock activation edge, output data DOUT corresponding to read data RD is output from data output terminal 4a.

In the structure of the second embodiment, the structure for reading and writing the data of one bit as shown in FIG. 17 may form a block, and the MRAM device may be formed of a plurality of blocks each having the same structure as that in FIG. 17, as already described with reference to FIG. 13. In this case, similar data read operations can be executed in parallel on the respective blocks. Thereby, the second read operation starting from time t1 can produce read data RD from the selected memory cell in each block. Therefore, at and after time t2 corresponding to the next clock activation edge, read data RD sent from the plurality of blocks can be output as output data DOUT in a burst fashion. In an operation example of FIG. 18, "0" corresponding to read data RD read from one of the blocks is output as output data DOUT at time t2, and "1" corresponding to read data RD read from another block is output as output data DOUT at time t3 corresponding to the next clock activation edge.

FIG. 18 illustrates the structure for executing the respective operations, which form single data read operation, in response to the activation edges of clock signal CLK. However, the invention is not restricted to the above structure and operation. More specifically, a timing control signal may be internally produced in response to clock signal CLK, and the single data read operation according to the second embodiment is executed within one clock cycle of clock signal CLK in response to the timing control signal thus produced. As already described, the number of clock cycles (clock signal CLK) required for single data read operation can be appropriately determined in accordance with the relationship between the time required for the single data read operation and the frequency of the operation clock.

According to the structure of the second embodiment, as described above, the data reading can be precisely executed in the self-reference manner on the memory array similar to that in the first embodiment. Further, the number of sense amplifiers arranged in the data read circuit can be reduced, and the number of voltages to be compared can be reduced. Owing to reduction in number of parts of the data read circuit, therefore, the area and cost can be reduced, and further the influence by the offset in the voltage comparing operation can be reduced so that the data read operation can be performed further precisely.

Further, the data read operation does not require the rewriting of data into the selected memory cell so that the operation can be higher than that of the data read operation according to the first embodiment.

Modification of the Second Embodiment

Figure 19:
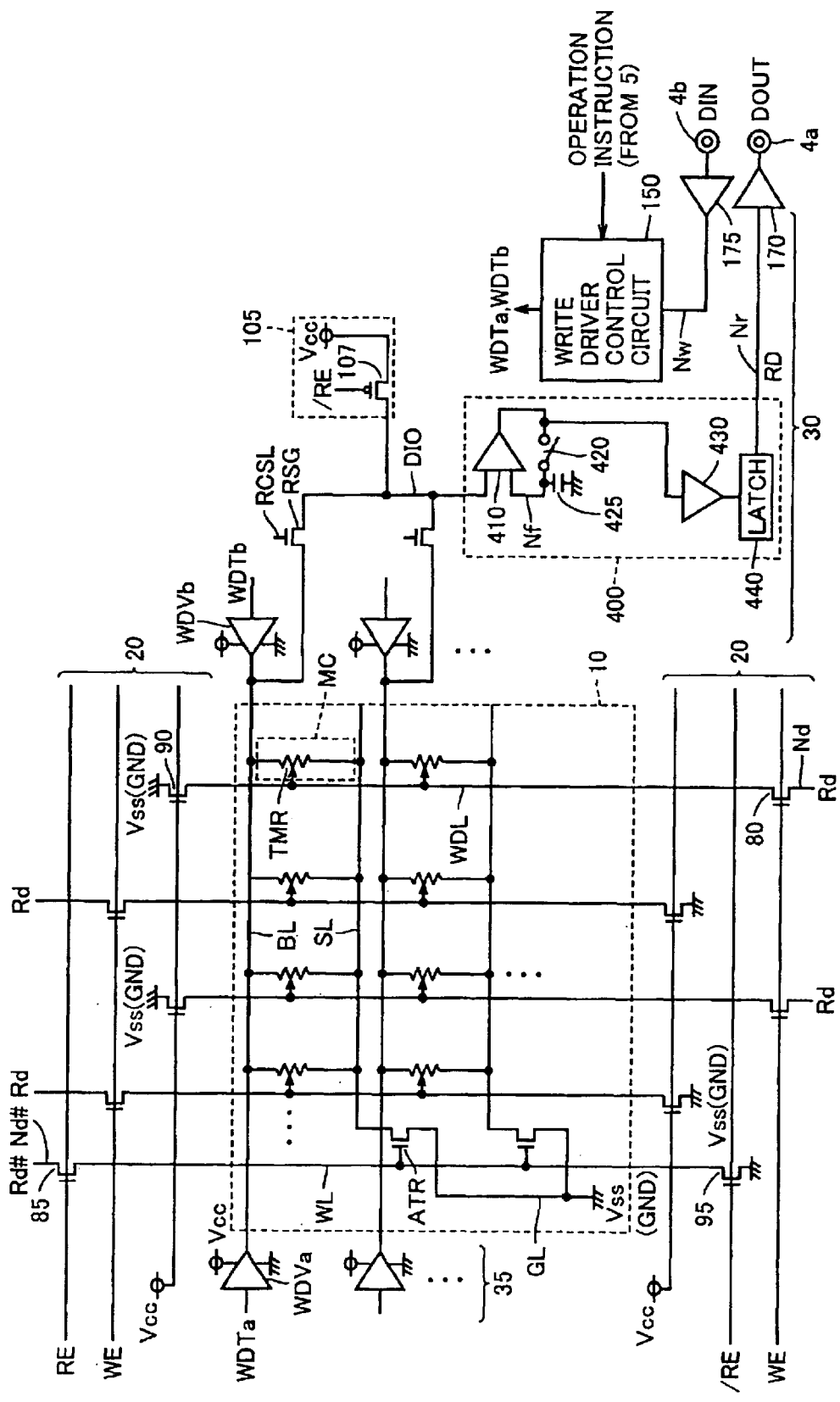
FIG. 19 is a circuit diagram showing a structure of a read/write control circuit according to a modification of the second embodiment.

FIG. 19 is a circuit diagram showing a structure of a read/write control circuit according to a modification of the second embodiment.

Referring to FIG. 19, the structure of the modification of the second embodiment differs from the structure of the second embodiment shown in FIG. 17 in that read/write control circuit 30 includes a data read circuit 400 instead of data read circuit 200. Structures and operations other than the above are substantially the same as those of the second embodiment, and therefore description thereof is not repeated.

Data read circuit 400 includes a sense amplifier 410 for amplifying a voltage difference between data line DIO and node Nf, a negative feedback switch 420 for feedback of the output of sense amplifier 410 to node Nf, a voltage holding capacitor 425 for holding the voltage on node Nf, a sense amplifier 430 for amplifying the output of sense amplifier 410, and a latch circuit 440, which amplifies and latches the output of sense amplifier 430 in accordance with predetermined timing to issue read data RD to node Nr.

In the data read operation according to the modification of the second embodiment, word line WL and read column select line RCSL corresponding to the selected memory cell are activated to attain H-level while digit line current I(WDL) is equal to zero, and negative feedback switch 420 is on. Thereby, data reading similar to that in the first read operation of the second embodiment is effected on the selected memory cell group including the selected memory cell.

In the first read operation, the voltage on node Nf approaches the voltage on data line DIO, i.e., the voltage corresponding to the storage data of the selected memory cell owing to the negative feedback by sense amplifier 410. When the voltage on node Nf reaches the stable state, negative feedback switch 420 is turned off.

After negative feedback switch 420 is turned off, word line WL and read column select line RCSL corresponding to the selected memory cell are kept active. In this state, the bias current starts to flow through write digit line WDL in the selected row, and will gradually increase. In accordance with this, the data reading similar to the second read operation of the second embodiment can be effected on the selected memory cell group while applying the predetermined bias magnetic field to the selected memory cell.

Consequently, memory cell resistance Rcell of the selected memory cell changes with the polarity corresponding to the storage data level. Thereby, the voltage on data line DIO gradually increases or decreases in accordance with the storage data level of the selected memory cell.

Accordingly, the output of sense amplifier 410 has the polarity, which changes depending on the storage data level of the selected memory cell. Consequently, read data RD having the level corresponding to the storage data level of the selected memory cell can be produced according to the output of sense amplifier 410, which is produced in accordance with predetermined timing after negative feedback switch 420 is turned off and bias current Ip flows through write digit line WDL. In the data read operation according to the modification of the second embodiment, as described above, the first and second read operations of in the second embodiment are continuously performed.

Owing to the above structure, the data reading can be performed rapidly with high precision similarly to the second embodiment. Since the structure according to the modification of the second embodiment utilizes the negative feedback by single sense amplifier 410 for obtaining the data line voltage corresponding to the storage data of the selected memory cell, the offset of the sense amplifier can be suppressed, and the data reading can be performed more precisely.

Third Embodiment

A third embodiment will now be described in connection with a structure of the memory array, in which the MTJ memory cells are arranged further efficiently.

Figure 20:
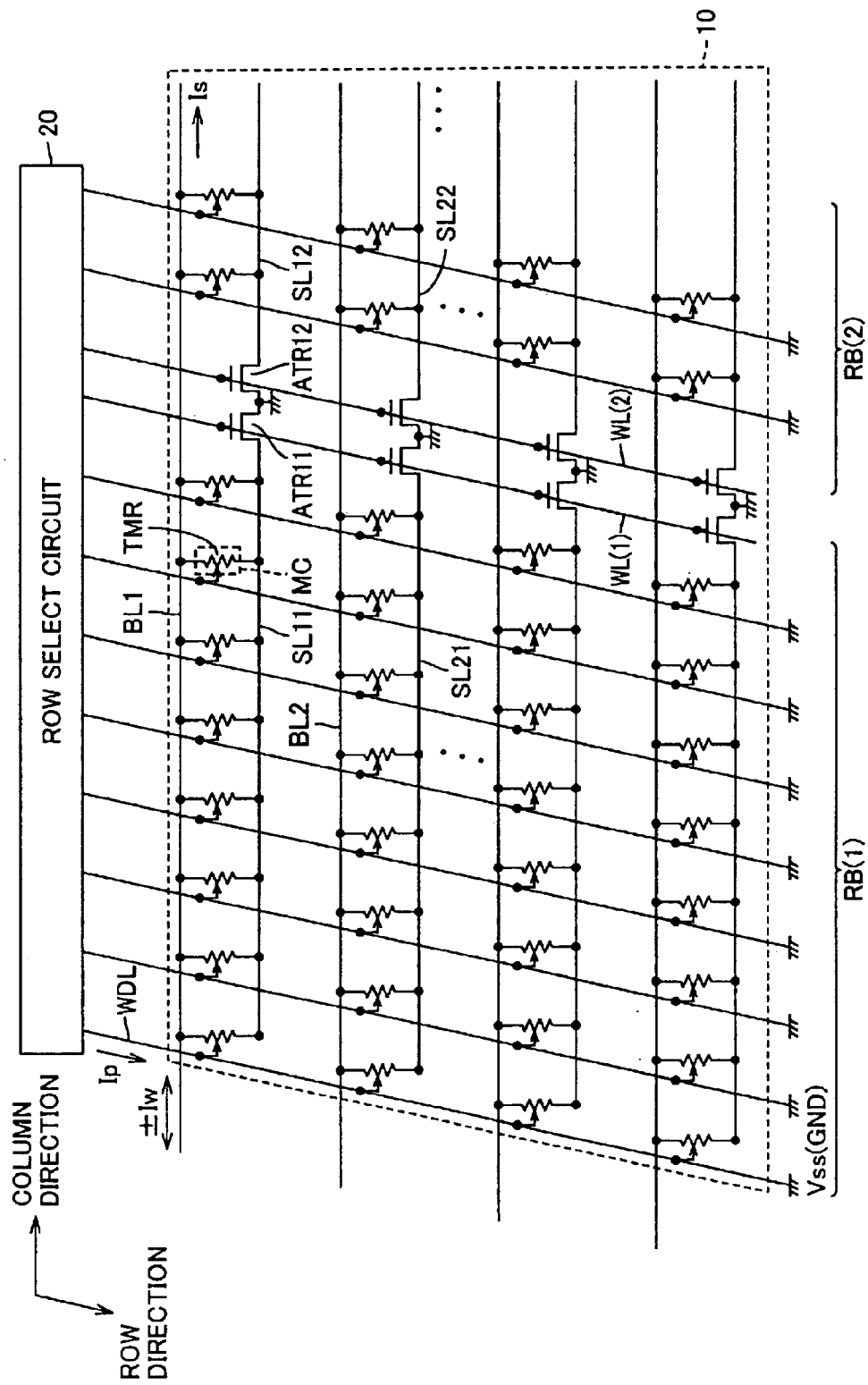
FIG. 20 is a circuit diagram specifically showing by way of example a structure of a memory array according to a third embodiment.

FIG. 20 is a circuit diagram specifically showing by way of example a memory array according to the third embodiment.

In the memory array structure shown in FIG. 20, each row block RB has eight memory cell rows, and thus L is equal to eight. Therefore, the same strap SL is coupled to eight tunneling magneto-resistance elements TMR. In the structure according to the third embodiment, access transistors ATR corresponding to the neighboring two row blocks neighbor to each other.

FIG. 20 representatively shows a structure of a portion corresponding to neighboring row blocks RB(1) and RB(2). In the first memory cell column corresponding to bit line BL1, straps SL11, SL12, . . . and access transistors ATR11, ATR12, . . . are arranged corresponding to row blocks RB(1), RB(2), . . . . Each of gates of the access transistor group corresponding to row block RB(1) is connected to word line WL(1), and each of gates of the access transistor group corresponding to row block RB(2) is connected to word line WL(2).

In each memory cell column, the access transistor group provided for row block RB(1) and including access transistor ATR11 and others neighbors to the access transistors provided for row block RB(2) and including access transistor ATR12 and others. Although not shown, the access transistor groups corresponding to next two row blocks RB(3) and RB(4) are located in a region between these row blocks, and neighbor to each other.

Figure 21:
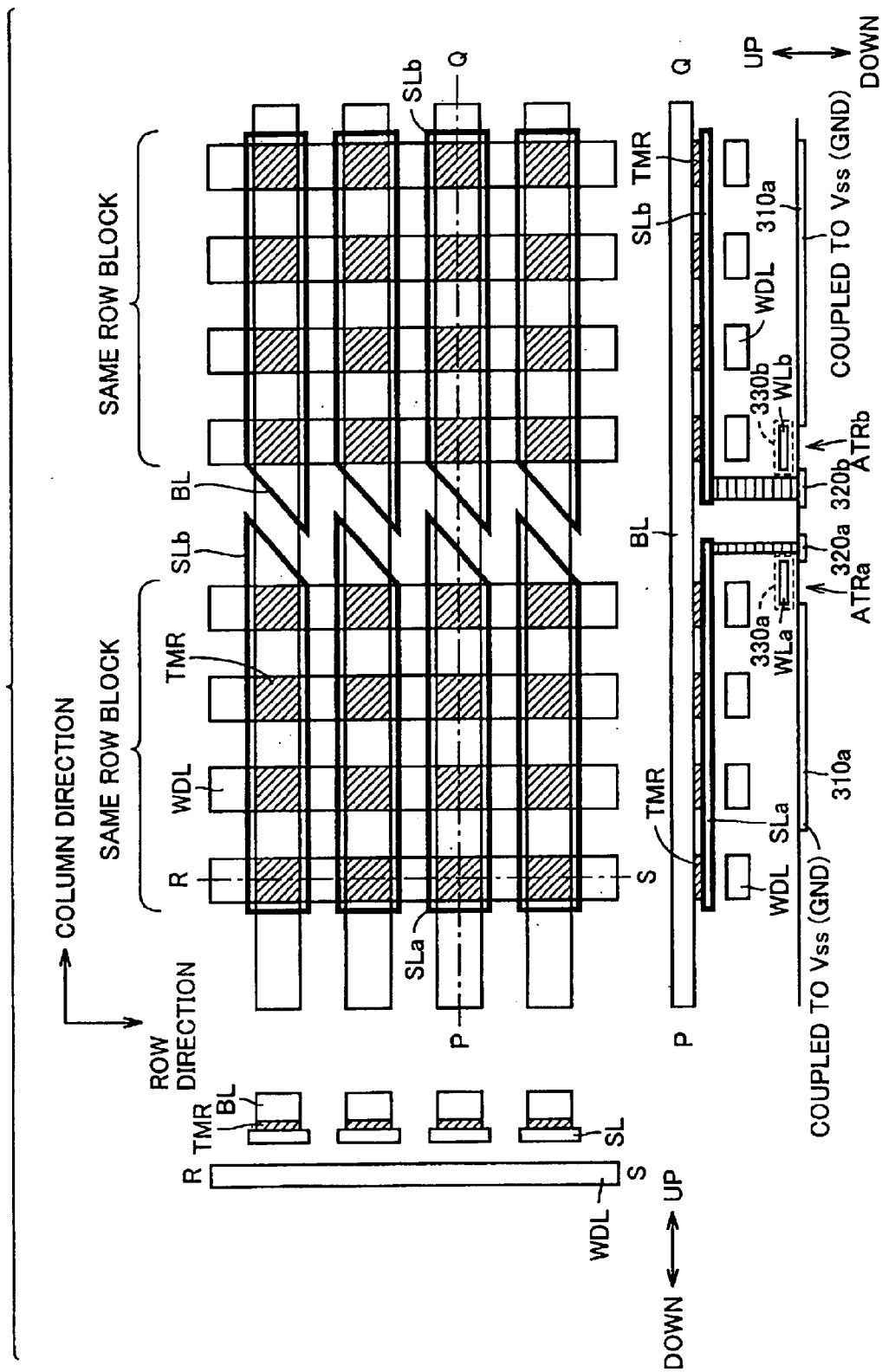
FIG. 21 shows by way of example a layout of MTJ memory cells in the memory array according to the third embodiment.

FIG. 21 representatively shows a layout structure of a boundary portion between the two row blocks. In the same memory cell column, straps SLa and SLb correspond to the neighboring two row blocks, respectively, and access transistors ATRa and ATRb corresponding to straps SLa and SLb are symmetrical with respect to the boundary line between these row blocks, as can be seen from a cross section taken along line P-Q. Thus, source/drain regions 310*a* and 320*a* as well as a gate 330*a* of access transistor ATRa are horizontally symmetrical to source/drain regions 310*b* and 320*b* as well as a gate 330*b*.

Thereby, the region occupied by access transistors ATR can be smaller than that in the array structure of the first embodiment, and the area thereof can be reduced. Further, neighboring straps SLa and SLb do not have completely square forms, but the neighboring edges thereof are inclined so that the arrangement pitch of these straps SLa and SLb can be small, and the area of the memory array can be further reduced. The forms of the straps can be controlled for the above purpose by appropriately determining a form of a mask used for producing the straps.

The writing and reading of the data into and from the memory array according to the third embodiment can be performed similarly to the first and second embodiments and the modifications thereof, and therefore, description thereof is not repeated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
a plurality of memory cells arranged in rows and columns, and divided along in a row direction into a plurality of row blocks each comprising a plurality of memory cell rows;
each of said memory cells including a tunneling magneto-resistance element having an electric resistance variable depending on magnetically written storage data;
a plurality of first signal lines arranged in a column direction, and corresponding to the memory cell columns, respectively; and
a plurality of second signal lines arranged corresponding to said plurality of row blocks in each of said memory cell columns, respectively,
said tunneling magneto-resistance element being electrically coupled between corresponding one of said plurality of first signal lines and corresponding one of said plurality of second signal lines.

2. The thin film magnetic memory device comprising:
a plurality of memory cells arranged in rows and columns, and divided along in a row direction into a plurality of row blocks;
each of said memory cells including a tunneling magneto-resistance element having an electric resistance variable depending on magnetically written storage data;
a plurality of first signal lines arranged in a column direction, and corresponding to the memory cell columns, respectively; and
a plurality of second signal lines arranged corresponding to said plurality of row blocks in each of said memory cell columns, respectively, wherein
said tunneling magneto-resistance element is electrically coupled between corresponding one of said plurality of first signal lines and corresponding one of said plurality of second signal lines,
the thin file magnetic memory device further comprising:
a plurality of word lines arranged in the row direction, corresponding to said plurality of row bocks, respectively, and being selectively activated in accordance with results of row selection in a data read operation; and
a plurality of access transistors arranged corresponding to said plurality of second signal lines, respectively, wherein
each of said access transistors is electrically coupled between corresponding one of said plurality of second signal lines and a fixed voltage, and is turned on when corresponding one of said word lines is activated.

3. The thin film magnetic memory device according to claim 2, wherein
in each of said memory cell columns, two of said access transistors respectively corresponding to neighboring two row blocks among said plurality of row blocks are arranged to neighbor to each other.

4. A thin film magnetic memory device comprising:
a plurality of memory cells arranged in rows and columns, and divided along in a row direction into a plurality of row blocks;
each of said memory cells including a tunneling magneto-resistance element having an electric resistance variable depending on magnetically written storage data;

a plurality of first signal lines arranged in a column direction, and corresponding to the memory cell columns, respectively; and a plurality of second signal lines arranged corresponding to said plurality of row blocks in each of said memory cell columns, respectively, wherein said tunneling magneto-resistance element is electrically coupled between corresponding one of said plurality of first signal lines and corresponding one of said plurality of second signal lines;

each of said row blocks has the memory cell rows of L (L: integer larger than one) in number;

the second signal line corresponding to the selected memory cell being selected as an access target is coupled to a first voltage over at least one predetermined period provided during a single data read operation;

said thin film magnetic memory device further comprising:

a data line to be electrically coupled to the first signal line corresponding to said selected memory cell during each of said at least one predetermined period, a read current supply circuit for coupling said data line to a second voltage during each of said at least one predetermined period, and a data read circuit for producing read data corresponding to the storage data of said selected memory cell; and said data read circuit has:

a first voltage holding portion for holding, on a first internal node, the voltage carried on said data line over the predetermined period provided corresponding to a first state keeping said selected memory cell to have a magnetization direction substantially the same as that before said single data read operation, and a voltage comparing portion for producing said read data in accordance with a difference between the voltage on said first internal node and the voltage carried on said data line over the predetermined period provided corresponding to a second state changing the magnetization direction of said selected memory cell from that in said first state by application of a predetermined magnetic field.

5. The thin film magnetic memory device according to claim 4, wherein said plurality of memory cells all operate as effective bits to perform the data storage.

6. The thin film magnetic memory device according to claim 4, further comprising:

a write control circuit for applying to one of said plurality of memory cells a data write magnetic field for writing said storage data, wherein said selected memory cell is changed to said second state by writing the storage data at a predetermined level by said write control circuit after said first state in said single data read operation, and said write control circuit rewrites said storage data at the same level as said read data produced by said data read circuit into said selected memory cell in said one data read operation.

7. The thin film magnetic memory device according to claim 6, wherein said selected memory cell is changed to a third state by writing the storage data at a level different from said predetermined level by said write control circuit after said second state, said data read circuit further has a second voltage holding portion for holding, on a second internal node, the voltage carried on said data line over the predetermined period provided corresponding to said second state, and said voltage comparing portion produces said read data in accordance with the voltages on said first and second internal nodes and the voltage carried on said data line over the predetermined period provided corresponding to said third state.

8. The thin film magnetic memory device according to claim 6, wherein said write control circuit stops said rewriting if the storage data of said selected memory cell before execution of said rewriting is at the same level as said read data produced by said data read circuit.

9. The thin film magnetic memory device according to claim 4, wherein said tunneling magneto-resistance element is magnetized in a direction along an easy axis in accordance with said storage data;

said thin film magnetic memory device further comprising a bias magnetic field applying portion for applying a predetermined bias magnetic field in a direction along a hard axis to said selected memory cell, wherein said selected memory cell changes from said first state to said second state when said bias magnetic field is applied in said single data read operation.

10. The thin film magnetic memory device according to claim 9, wherein said bias magnetic field applying portion includes:

a plurality of write digit lines arranged corresponding to the memory cell rows, respectively, and a row driver for activating the write digit line corresponding to the selected row in accordance with results of a row selection;

the write digit line activated by said row driver during a data write operation carries a current for generating a predetermined magnetic field in the direction along said hard axis; and said row driver portion activates the write digit line corresponding to said selected row similarly to said data write operation in said second state during said single data read operation.

11. The thin film magnetic memory device according to claim 9, wherein said voltage comparing portion includes:

a sense amplifier for amplifying a voltage difference between said data line electrically coupled to said selected memory cell and a first internal node, a switch circuit for connecting an output node of said sense amplifier to said first internal node in said first state, and isolating said output node of said sense amplifier from said first internal node in said second state, and a read data producing circuit for producing said read data in accordance with a voltage on said output node in said second state.

* * * * *